United States Patent
Sexton et al.

(10) Patent No.: US 7,662,254 B2
(45) Date of Patent: Feb. 16, 2010

(54) METHODS OF AND APPARATUS FOR ALIGNING ELECTRODES IN A PROCESS CHAMBER TO PROTECT AN EXCLUSION AREA WITHIN AN EDGE ENVIRON OF A WAFER

(75) Inventors: Gregory S. Sexton, Fremont, CA (US); Andrew D. Bailey, III, Pleasanton, CA (US); Alan M. Schoepp, Ben Lomond, CA (US); John D. Boniface, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 329 days.

(21) Appl. No.: 11/704,870

(22) Filed: Feb. 8, 2007

(65) Prior Publication Data
US 2008/0190556 A1 Aug. 14, 2008

(51) Int. Cl.
*C23F 1/00* (2006.01)
*H01L 21/306* (2006.01)
(52) U.S. Cl. .................................. 156/345.43
(58) Field of Classification Search ............. 156/345.43
See application file for complete search history.

(56) References Cited

U.S. PATENT DOCUMENTS

| | | | |
|---|---|---|---|
| 5,246,532 A | 9/1993 | Ishida | 156/345 |
| 5,273,588 A | 12/1993 | Foster et al. | 118/723 E |
| 5,826,345 A * | 10/1998 | Hendricks | 33/365 |
| 6,364,957 B1 | 4/2002 | Schneider et al. | 118/728 |
| 6,676,760 B2 | 1/2004 | Kholodenko et al. | 118/728 |
| 6,837,967 B1 | 1/2005 | Berman et al. | 156/345.3 |
| 2004/0238488 A1 * | 12/2004 | Choi et al. | 216/58 |
| 2005/0172847 A1 * | 8/2005 | Lassen | 101/477 |

FOREIGN PATENT DOCUMENTS

| | | | |
|---|---|---|---|
| DE | 3928971 | * | 3/1991 |
| JP | 61-577 | | 1/1986 |
| JP | 62-128538 | | 6/1987 |
| JP | 62-287072 | | 12/1987 |
| JP | 1-230766 | | 9/1989 |

OTHER PUBLICATIONS

English abstract and translation of DE 3928971, Neumann, Mar. 1991.*

* cited by examiner

*Primary Examiner*—Michael Cleveland
*Assistant Examiner*—Keath T Chen
(74) *Attorney, Agent, or Firm*—Martine Penilla & Gencarella LLP

(57) ABSTRACT

Positional relationships are established in a process chamber. A base is configured with a lower electrode surface to support a wafer, and an upper electrode has a lower surface. A drive mounted on the base has a linkage connected to the upper electrode. A fixture placed on the lower surface moves into a desired orientation of the lower electrode. With the upper electrode loosely connected by the linkage to the drive, the fixture transfers the desired orientation to the upper electrode. The linkage is tightened to maintain the desired orientation, the fixture is removed and a process exclusion insert is mounted to the upper electrode. The drive moves the upper electrode and the insert to define an inactive process zone between the upper electrode and the wafer on the lower electrode to protect a central area of the wafer during etching of a wafer edge environ around the central area.

12 Claims, 12 Drawing Sheets

METHODS OF AND APPARATUS FOR ALIGNING ELECTRODES IN A PROCESS CHAMBER TO PROTECT AN EXCLUSION AREA WITHIN AN EDGE ENVIRON OF A WAFER

RELATED APPLICATION

This application is related to U.S. Pat. No. 7,575,638 entitled "Apparatus For Defining Regions of Process Exclusion and Process Performance In A Process Chamber", filed on Feb. 2, 2007, referred to as the "Related Application". The disclosure of the Related Application is incorporated by reference.

BACKGROUND

1. Field

The present invention relates generally to semiconductor manufacturing and, more particularly, to apparatus for aligning electrodes in a process chamber to define regions of process exclusion and of process performance in the process chamber for manufacturing semiconductor wafers.

2. Description of the Related Art

Vacuum processing chambers have been used for etching materials from substrates and for deposition of materials onto substrates. The substrates have been semiconductor wafers, for example. In general, accurate processing (and thus high yields of devices) is expected to occur in a central area of the wafer. Numerous difficulties are experienced in attempting to accurately process the wafer on a portion of a top, or upper, surface of the wafer, wherein that portion is between the central area and a peripheral edge of the wafer that surrounds the central area. Such difficulties are significant enough that an "edge exclusion area" has been defined between the central area and that peripheral edge of the wafer surrounding that central area. No attempt is made to provide acceptable devices in that edge exclusion area.

Additionally, during the desired processing of the central area, undesired deposits, materials, or process-by-products (collectively "undesired materials"), accumulate or result on the edge exclusion area of the upper surface of the wafer, and on a peripheral edge area of the peripheral edge of the wafer, and below the peripheral edge area onto a bottom area of an opposite (bottom) surface of the wafer. Those three areas are not to be processed to form devices. The edge exclusion area, the edge area, and the bottom area are referred to collectively as the "edge environ". These undesired materials may generally accumulate on the edge environ. The accumulation may be so extensive that the desired processing of the central area must be interrupted because, in general, it is desired to keep the edge environ substantially clean, so as to avoid flaking of material particulates that may redeposit back onto the active device regions on the upper surface of the wafer. Such flaking can occur during any number of wafer handling or transport operations, and thus, it is a general desire that the edge environ be periodically cleaned (e.g., etched) or monitored for cleaning (i.e., etching) during the numerous processing operations used to fabricate integrated circuit device chips, from the processed wafers. The desired processing of the central area has been interrupted to perform such periodic cleaning in an attempt to remove the undesired materials from the edge environ, e.g. from the entire edge environ, and e.g., to perform such removal without damaging the devices.

In view of the foregoing, there is a need to assure that such needed apparatus is accurately aligned before use, so that in use the apparatus results in accurate (e.g., uniform) removal of the undesired materials from the entire edge environ, without removing materials from or otherwise damaging the central area.

SUMMARY

Broadly speaking, embodiments of the present invention fill these needs in the context of embodiments of the Related Application that provide semiconductor manufacturing apparatus configured for defining separate regions of process exclusion and process performance in a process chamber for manufacturing the semiconductor wafers. The apparatus of the Related Application may be configured so that a process such as etching is excluded from the central area of the wafers, and a process such as etching is allowed to be performed on the wafer only on the edge environ. Embodiments of the present invention fill these needs by assuring that electrodes of such needed apparatus are accurately aligned before use, so that use of such needed apparatus results in accurate (e.g., uniform) removal of the undesired materials from the entire edge environ, without removing materials from or otherwise damaging the central area.

Embodiments of the present invention may provide apparatus for aligning first and second spaced reference surfaces in a wafer process chamber. A fixture may be configured with an upper fixture reference surface and a lower fixture reference surface parallel to the upper fixture reference surface. The lower fixture reference surface may be configured to be supported on the first spaced reference surface to orient the lower fixture reference surface and the upper fixture reference surface parallel to the first spaced reference surface. The upper fixture reference surface may be configured to support the second spaced reference surface to orient the second spaced reference surface parallel to the upper fixture reference surface and parallel to the first spaced reference surface.

Embodiments of the present invention may also provide apparatus for orienting an upper electrode relative to a desired existing orientation of a lower electrode in a wafer process chamber, each electrode being configured with a reference surface. A fixture may be configured with an upper nest and a lower nest, the upper nest being configured with an upper fixture reference surface and an upper wall. The lower nest may be configured with a lower fixture reference surface and a lower wall. The lower fixture reference surface may be parallel to the upper fixture reference surface. The upper wall may be coaxial with and parallel to the lower wall. Each of the upper nest and lower nest may be configured to receive at least a portion of the respective upper and lower electrode reference surface. The nests orient the upper electrode relative to the desired existing orientation of the lower electrode by aligning the lower fixture reference surface and the upper fixture reference surface parallel to the lower electrode reference surface and by centering the upper electrode relative to the lower electrode.

Embodiments of the present invention may provide apparatus for establishing positional relationships in a process chamber for protecting an exclusion area within an edge environ of a wafer. Apparatus may include a lower electrode configured with a first electrode reference surface to support a wafer to be processed on the edge environ. A base may be configured with a frame, the base being configured to mount the lower electrode with the first electrode reference surface in a desired orientation for processing the edge environ and not the exclusion area of the wafer. A process exclusion insert may be configured with parallel first and second insert surfaces for protecting the exclusion area from processing. An upper electrode may be configured with a second electrode reference surface to removably mount the insert with the first insert surface against the second electrode reference surface and the second insert surface parallel to the second electrode reference surface. An alignment fixture may be configured for use with the upper electrode and the lower electrode instead of the insert. The fixture may be configured with an upper fixture reference surface and a lower fixture reference surface parallel to the upper fixture reference surface. The fixture may be configured so that the lower fixture reference surface mates with the first electrode reference surface to support the fixture on the lower electrode with the lower fixture reference surface and the upper fixture reference surface in the desired orientation. The fixture may be configured so that the upper fixture reference surface mates with the second electrode reference surface to removably support the upper electrode on the fixture with the upper electrode reference surface in the desired orientation parallel to the upper first electrode reference surface. An adapter may be between the frame and the upper electrode, the adapter being adjustable between a loose configuration and a tight configuration. In the loose configuration the adapter defines variable alignment spaces between the adapter and the frame to allow the upper electrode to be supported on the fixture in the desired orientation. In the tight configuration the adapter secures the upper electrode to the frame with the upper electrode in the desired orientation to permit removal of the fixture and mounting of the insert on the upper electrode while the upper electrode remains in the desired orientation to protect the exclusion area from processing.

Embodiments of the present invention may provide a method of orienting an upper electrode relative to a lower electrode having a desired existing orientation in a process chamber to define active and inactive process zones in the process chamber for processing a wafer. The method may comprise an operation including configuring each electrode with a reference surface. A lower electrode reference surface may be in the desired existing orientation. An upper electrode reference surface is to be oriented parallel to the lower electrode reference surface. Another operation may temporarily hold the upper electrode reference surface oriented parallel to the lower electrode reference surface. Yet another operation secures the upper electrode to a drive to mount the upper electrode reference surface parallel to the lower electrode reference surface.

It will be obvious; however, to one skilled in the art, that embodiments of the present invention may be practiced without some or all of these specific details. In other instances, well known process operations have not been described in detail in order not to obscure the present invention.

BRIEF DESCRIPTION OF THE DRAWINGS

The embodiments of the present invention will be readily understood by reference to the following detailed description in conjunction with the accompanying drawings in which like reference numerals designate like structural elements, and wherein.

Other aspects and advantages of embodiments of the invention will become apparent from the following detailed description, taken in conjunction with the accompanying drawings, illustrating by way of example the principles of embodiments of the present invention.

DETAILED DESCRIPTION

In the following description, numerous specific details are set forth in order to provide a thorough understanding of embodiments of the present invention. It will be apparent, however, to one skilled in the art that the present invention may be practiced without some or all of these specific details. In other instances, well known process operations have not been described in detail in order not to obscure the present invention.

Embodiments of the present invention described below fill the above-described needs in semiconductor manufacturing apparatus configured for defining separate regions of process exclusion and process performance in a process chamber for manufacturing the semiconductor wafers. For the process exclusion, such apparatus may be configured so that a process (e.g., etching) is excluded from the central area of the wafers. For the process performance, the exemplary etching process may be allowed to be performed on the wafer only on the edge environ. Embodiments of the present invention fill these needs by assuring that electrodes of such apparatus are accurately aligned before use. In this manner, such apparatus may be set up so as to exclude etching from the central area of the wafers, the set up allowing the exemplary etching process to be performed only on the edge environ of the wafer. Embodiments of the present invention fill these needs so that as set up with the accurate alignment of the surfaces that define an etching chamber of such apparatus, in use the etching chamber accurately (e.g., uniformly) removes the undesired materials from the entire edge environ, without removing materials from or otherwise damaging the central area.

Figure 1:
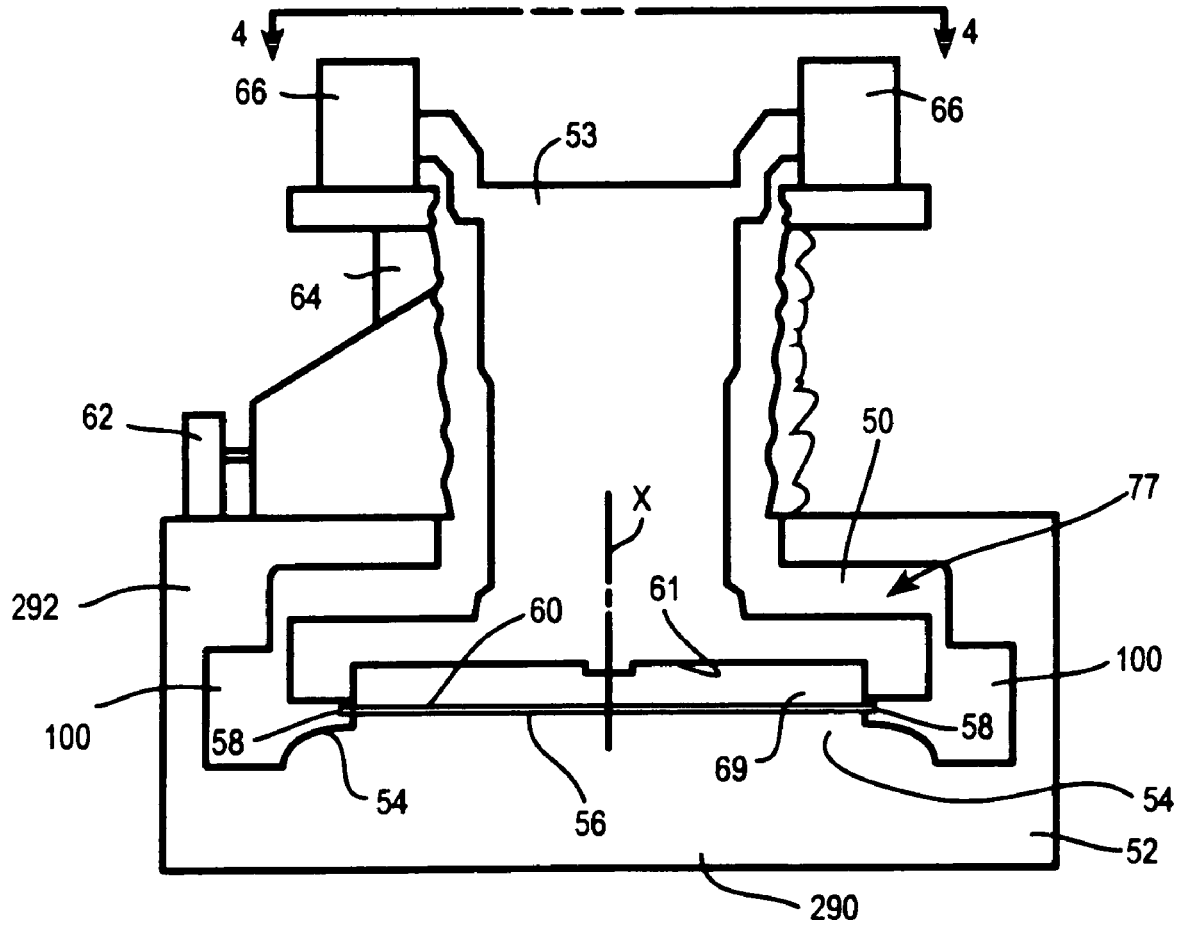
FIG. 1 is a schematic elevational view of a process chamber of an embodiment of the present invention in which a plurality of positional relationships may be established between a base, such as a bottom, or lower, electrode or chuck, and an upper, or top, electrode.

FIG. 1 shows a process chamber 50 in which a plurality of positional relationships may be established. Generally, the positional relationships may be established between a base 52 and a top, or upper, electrode 53 in the chamber 50. In more detail, the base 52 may be configured with a lower, or bottom, electrode (or chuck) 54 having a first electrode reference surface 56 to support a wafer 58 to be processed, as by etching or another desired process suitable for removing the undesired materials from the wafer. The upper electrode 53 may be configured with a second electrode reference surface 60 and with a third reference surface 61. The upper electrode 53 is configured to provide power for processing the supported wafer.

Figure 2A:
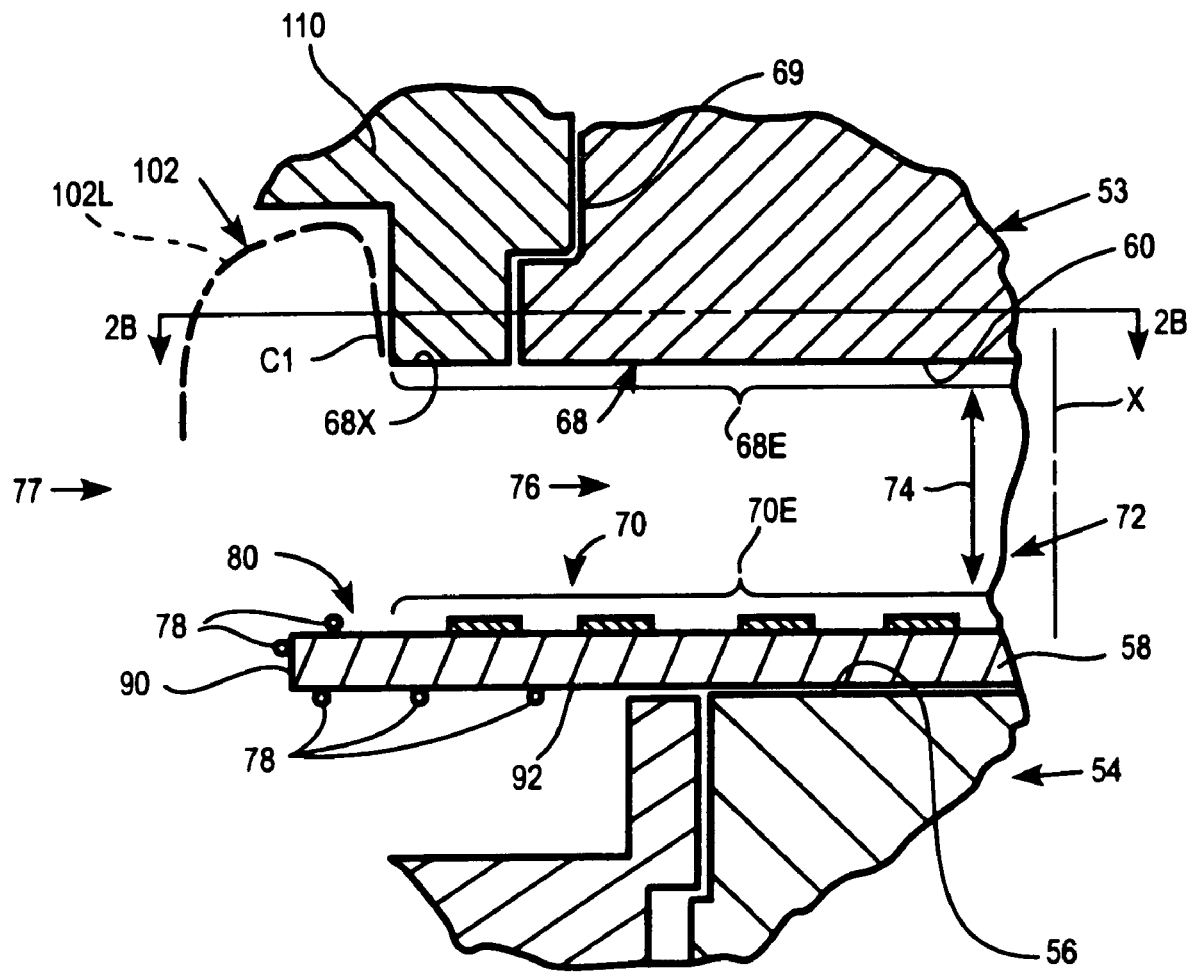
FIG. 2A is a view of an enlarged portion of FIG. 1 in which one of the positional relationships is illustrated between a first reference surface of the lower electrode and a second reference surface of the top electrode.
Figure 2B:
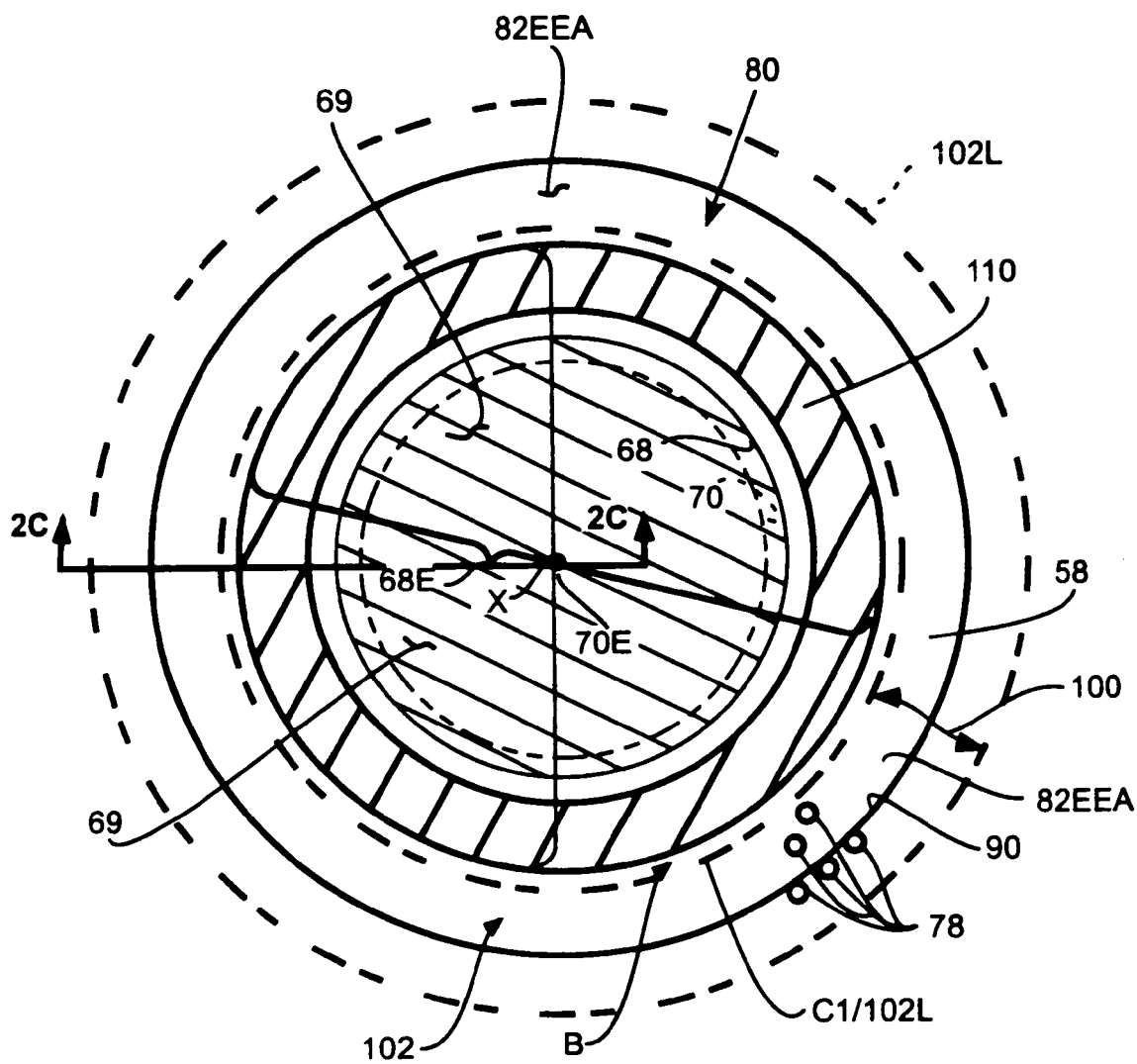
FIG. 2B is a cross sectional view taken along line 2B-2B in FIG. 2A, illustrating a toroidal configuration of an etching region defined between the lower electrode and the top electrode.
Figure 2C:
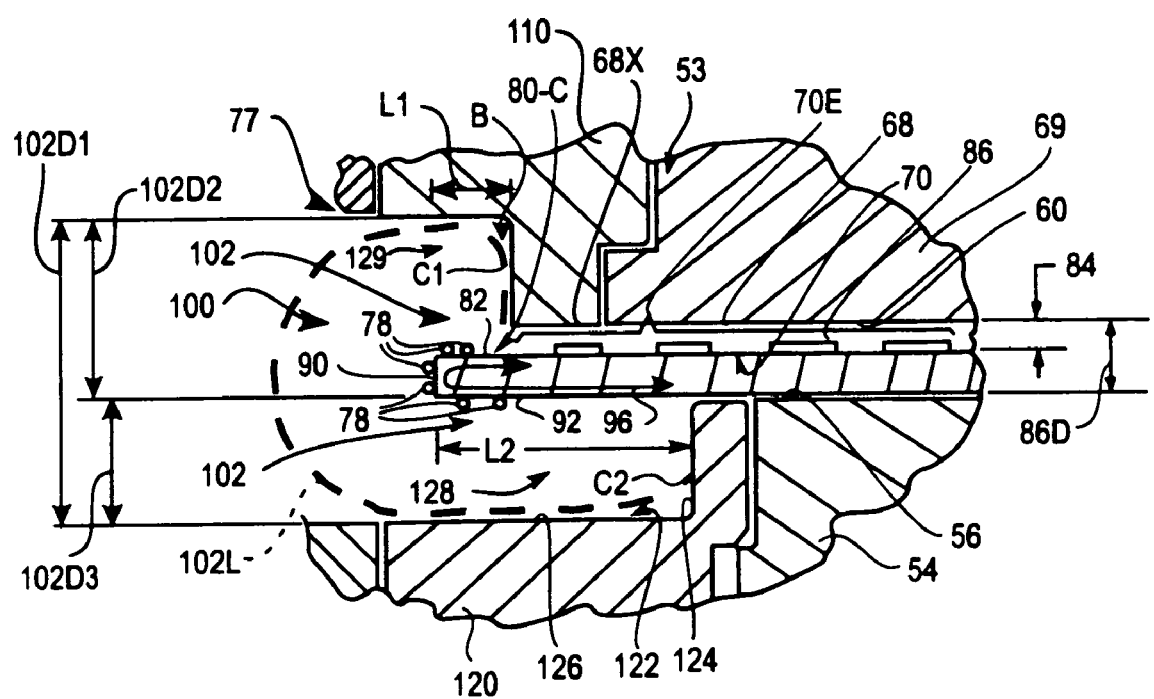
FIG. 2C is a cross sectional view taken along line 2C-2C in FIG. 2B, illustrating an enlarged view of the top electrode configured with a process exclusion insert having the second reference surface at a center area, the second reference surface being in the second positional relationship with the first reference surface, showing a generally C-shaped cross sectional configuration of one embodiment of the toroidal etching region.

FIG. 2A shows an enlarged portion of FIG. 1, illustrating a first of the positional relationships between, or with respect to, the first reference surface 56 and the second reference surface 60. For establishing the relationships, FIG. 1 shows a drive 62 mounted on the base 52 and configured with an embodiment of a linear motor, such as a wedge assembly 64, mounted on the base 52. FIG. 1 also shows a linkage 66 connected between the drive 62 and the upper electrode 53. The linkage 66 may be adjustable to allow establishment of a desired orientation between the respective first and second reference surfaces 56 and 60, e.g., parallelism of the respective first and second reference surfaces 56 and 60. Tightening of the linkage 66 may also maintain that desired orientation while the drive 62 moves the upper electrode 53 to establish a positional relationship for processing the wafer. The enlarged view of FIGS. 2A & 2C show that moving the upper electrode 53 may cause the respective first and second reference surfaces 56 and 60 to move relative to each other. The movement may be from the first positional relationship (FIG. 2A) to a second positional relationship shown in FIG. 2C, and back again.

Figure 3:
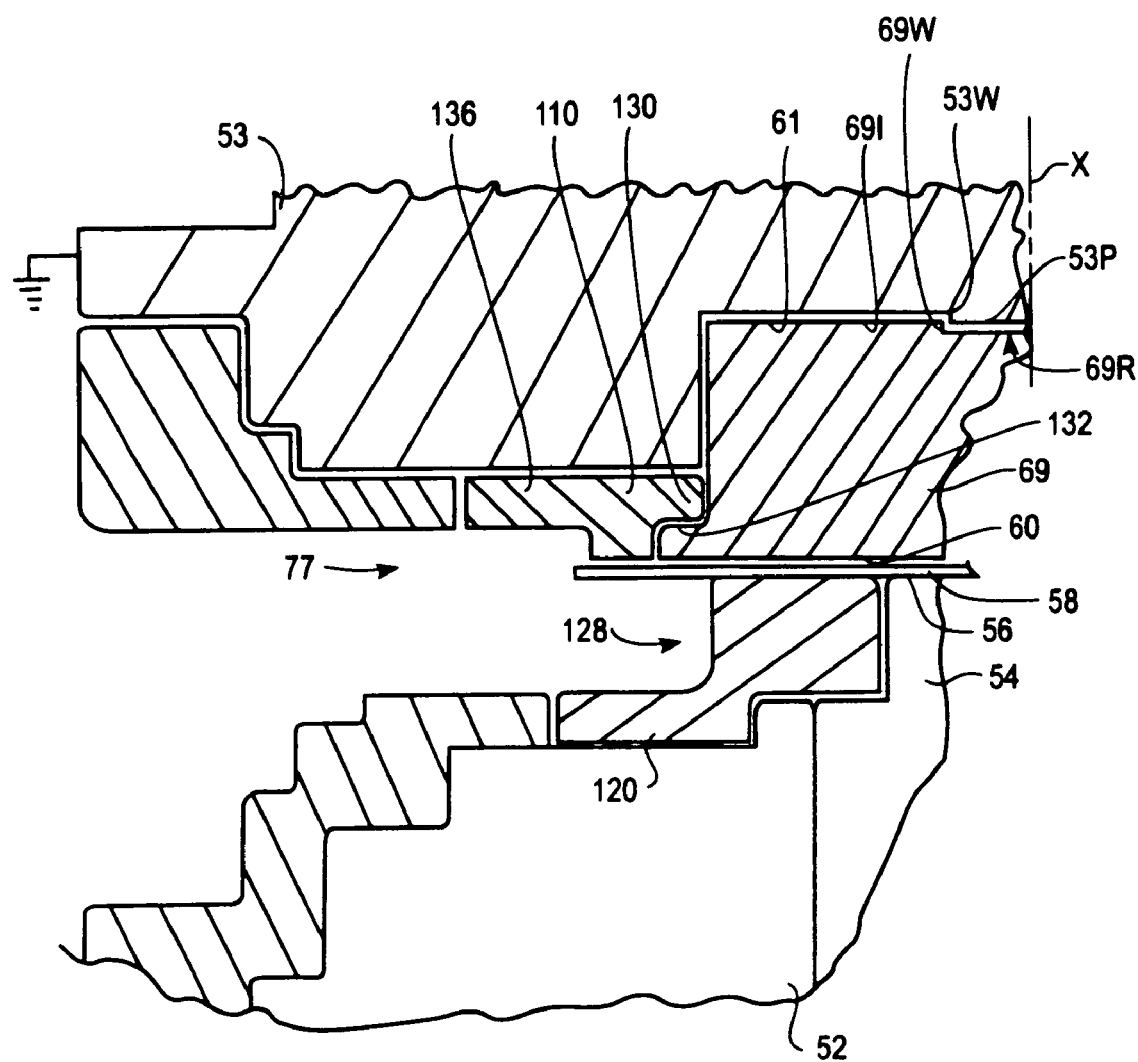
FIG. 3 is a cross sectional view illustrating a wafer supported by the lower electrode, showing top and bottom edge defining rings to enable etching of an edge environ of the wafers.

FIG. 2A shows the upper electrode 53 having a center area 68. The center area 68 extends radially as shown by a portion of bracket 68E. The cross sectional view of FIG. 2B shows the center area 68 as being circular and the wafer 58 having a center at axis X. The center area 68 is not powered and may be configured from a process exclusion insert 69. FIG. 3 shows that the insert 69 may be configured with an inner (or upper) reference surface 69I that is mounted on (i.e. fixed to) the third reference surface 61 of the upper electrode 53. The upper reference surface 69I of the insert is configured with a recess 69R that is coaxial with the axis X and may be configured as a hole extending through the insert 69. The insert 69 is centered on the upper electrode 53 by a projection 53P that is coaxial with the axis X. The projection 53P extends into the recess 69R of the insert 69. The recess 69R and the projection 53P have respective mating cylindrical walls 53W and 69W that are coaxial with the axis X.

By way of an outer (or lower) surface of the insert 69 opposite to the inner reference surface 69I, the upper electrode 53 is configured with the second reference surface 60, such that the second reference surface 60 may be referred to as an outer reference surface of the insert 69. The respective inner and second reference surfaces 69I and 60 are parallel. Thus, with the inner reference surface 69I of the insert 69 mounted on (and secured to) the third reference surface 61, and with the inner and outer reference surfaces 69I and 60 parallel, orientation of the third reference surface 61 parallel to the first reference surface 56 provides the second (outer) reference surface 60 parallel to the lower reference surface 56. The insert 69 may be fabricated from a dielectric such as ceramic, for example. A portion of the center area 68 identified by 68X extends radially further outwardly than the insert 69, and is described below.

FIG. 2A shows the insert 69 configured with the second reference surface 60 opposite to a central area 70 of the wafer. In the first positional relationship shown in FIG. 2A, a space 72 separates the second reference surface 60 from the first reference surface 56 when the wafer 58 is supported by the lower electrode 54 and centered on the axis X. The space 72 is configured extending radially across (or between) the insert 69 and the wafer 58, and extends in a vertical, or axial, direction (arrow 74) of the axis X, and this axial extension is sufficient (large) in two respects. One, the space 72 is configured to permit access to the wafer 58 on the lower electrode 54 for loading the wafer on the lower electrode and removing the wafer from the lower electrode. Two, the space 72 is also configured to provide a normal-size process, or etching, zone 76 between the upper electrode 53 and the central area 70 of the wafer 58 that is on the lower electrode 54. With this space 72, if the upper electrode 53 were powered, a plasma could light up in the normal-size zone 76. It may be appreciated that with the normal-size process zone 76 between the upper electrode 53 and the wafer (resulting from the first positional relationship), such plasma would have access to the central area 70. It may be understood then that the space 72 (and the normal-size zone 76) may be part of a process chamber cavity 77.

In FIG. 2A, bracket 70E defines a left and a central extent of the central area 70 that extends to the axis X. In FIG. 2B, bracket 70E shows the full extent of the central area 70. FIG. 2A shows that when the desired process is for removing undesired materials 78 only from edge environ 80 of the wafer, and not for removing undesired materials 78 or any other materials from the central area 70 where devices may be on the wafer, the plasma in normal-size process zone 76 would be unacceptable because the devices must not be damaged (e.g., by the plasma).

Embodiments of the present invention promote avoiding such damage to the devices, and promote limiting the plasma to action on edge environ 80 that is to be subjected to the processing. FIG. 2C shows the second positional relationship, and illustrates the second reference surface 60 in close proximity to the central area 70 of the wafer 58 when the wafer is supported by the lower electrode 54. Bracket 70E indicates a portion of the radial extent of the central area 70 that extends from the axis X of the wafer 58. The second reference surface 60 in close proximity to the first reference surface 56 is almost touching an upper surface 82 of the wafer. E.g., surface 60 may be separated from the surface 82 by a space 84 defined below. FIG. 2C shows that in the second positional relationship, the described space 72 (FIG. 2A) no longer exists. As a result, when portions of the upper electrode 53 are powered, no plasma access to the central area 70 of the wafer 58 is permitted, and there is no normal-size process (etching) zone 76 between the center area 68 of the upper electrode 53 and the central area 70 of the wafer 58 on the lower electrode 54. Thus, a plasma may not light up between the center area 68 and the central area 70. Instead of the space 72 and instead of the normal-size zone 76 of the chamber cavity 77, FIG. 2C shows that with the surfaces 56 and 60 in close proximity the space 84 is axially-thin and defines the chamber cavity 77 as being configured with an inactive etching zone 86 between the central area 70 of the wafer and the center area 68 of the top electrode 53. The zone 86 defined by the thin space 84 is referred to as an "inactive" etching zone because the central area 70 and the center area 68 are so close that a plasma cannot light up in the thin space 84. Thus, when there are process operations allowed to be conducted in other portions of the chamber 77, no etching occurs in the space 84 and such devices as may be on the central area 70 of the wafer 58 are not damaged. This spacing of the central area 70 and the center area 68 results from the close proximity of the second reference surface 60 with the first reference surface 56 and may configure the inactive etching zone 86 with a dimension in a direction of movement of the electrode 53 (i.e., the direction of the X axis) of about 0.010 inches to about 0.020 inches, for example, and with a dimensional tolerance of about plus or minus 0.002 inches.

Embodiments of the present invention promote avoiding such damage to the devices by aligning the upper electrode 53 with the lower electrode 54 to define the desired orientation between the first and second reference surfaces 56 and 60, e.g., parallelism of the respective first and second reference surfaces 56 and 60. This alignment of the upper electrode 53 with the lower electrode 54 (for that desired orientation) is established by the embodiments of the present invention with the linkage 66 loosened. With this alignment maintained temporarily, the linkage 66 may be tightened and embodiments of the present invention may be removed. With the insert 69 mounted on the upper electrode 53, the tightened linkage 66 maintains the desired orientation, e.g., parallelism of the respective first and second reference surfaces 56 and 60. In this manner, the desired orientation is maintained when the drive 62 then moves the upper electrode 53 relative to the lower electrode 54 (e.g., to cause the respective first and second reference surfaces 56 and 60 to move relative to each other from the first positional relationship, FIG. 2A, to the second positional relationship shown in FIG. 2C, and back again). By maintaining the desired orientation, the axially-thin space 84 that defines the inactive etching zone 86 is uniformly maintained. In this regard, "uniformly" (and a "uniform spacing") are defined as the central area 70 and the center area 68 being both close and parallel, and with the same distance existing between the first and second reference surfaces 56 and 60 measured at various distances from and around the axis X. As a result of the uniform spacing, the plasma does not light up in the thin space 84 and the devices on the central area 70 are not damaged.

The embodiments of the present invention that align the upper electrode 53 with the lower electrode 54 not only define the desired orientation between the first and second reference surfaces 56 and 60, but also promote uniformity of processing of the edge environ 80 that is to be subjected to the processing, e.g., etching. FIG. 2B shows the edge environ 80 including a peripheral edge 90 of the wafer. The edge 90 is radially spaced from the axis X of the wafer, e.g., for a 300 mm wafer 58, the radial space from the axis X is thus 150 mm. The upper surface 82 (FIG. 2C) of the wafer extends radially inward from the edge 90 and includes the central area 70. A bottom surface 92 of the wafer is below the edge 90 and opposite to the upper surface 82. FIG. 2B shows the edge environ 80 extending radially inwardly from the edge 90 along an outer annular portion of the upper surface 82. The outer annular portion extends radially relative to the axis X. The amount of this radial inward portion is described below, and may include the above-described edge exclusion area defined between the central area 70 and the edge 90. To indicate that the edge exclusion area is part of the upper surface 82, the edge exclusion area is identified by 82EEA in FIG. 2B, and is thus also a part of the edge environ 80. As described above, the edge exclusion area 82EEA surrounds the central area 70, and in the processing of the central area 70 no attempt is made to provide acceptable devices on that edge exclusion area 82EEA.

For clarity of description, in FIG. 2C a curved line 96 indicates an extent of the edge environ 80 (identified there as 80-C, as described below). Line 96 identifies the edge environ as an annular surface portion of the outer extremity of the wafer. The wafer axis X is at the center of the annular portion. FIG. 2C shows the annular edge environ 80 (i.e., the edge 90, and portions of the surfaces 82 and 92) having an accumulation of the undesired materials 78. FIG. 2B shows some of the materials on the portion of the upper surface 82 corresponding to the edge exclusion area 82EEA and on the edge 90. Thus, it is the annular edge environ 80 (the annular portion comprising edge 90, and areas, or portions, of surfaces 82 and 92) that is not to be processed to form devices, and that is to be etched to remove the materials 78. Also, it is the edge environ 80 from which it is desired to have uniform removal of the undesired materials 78, so that complete removal of the materials 78 occurs all around the outer annular portion of the wafer, i.e., complete removal from the edge environ 80. This removal is uniform removal all around the wafer axis X.

FIG. 1 shows the process chamber 50 defining the chamber cavity 77 that encloses a lower section of the upper electrode 53 and encloses the lower electrode 54. FIG. 2C also shows that with the second positional relationship established, the chamber cavity 77 of the process chamber 50 may be configured with a toroidal, or annular, etching region 100 defined between the upper electrode 53 and the lower electrode 54. The etching region 100 defines a configurable active etching, or active etch, zone 102 shown inside a dash-dot-dash line 102L. An exemplary cross-section of the region 100 is shown defined by the line 102L in FIG. 2C. The annular etching region 100 shown in FIG. 2C is illustrated as being configured with one embodiment of the active etching zone 102 having an exemplary generally C-shaped cross section. This C-shape extends around, or encompasses, the annular edge environ 80 and extends from one end C1 to an opposite end C2. For reference, in FIG. 2A the end C1 of the line 102L identifying the active etching zone 102 is shown. In the cross section of FIG. 2B the end C1 and line 102L are shown as being circular and extending around the axis X, indicating the radial location of the outside of the toroidal region 100.

The active etching zone 102 is also shown adjacent to the edge environ 80 (see 80-C). In FIG. 2A the section line 2B-2B also crosses the line 102L. Line 102L is also shown in FIG. 2B extending radially outward of the edge 90 to indicate the radial amount (or extent) of the annular etching region 100. The exemplary generally C-shaped cross section of the region 100 is a region of plasma light up. In FIG. 2C the region 100 with this exemplary cross section is shown adjacent to a top radially-extending length L1 of the wafer upper surface 82. For this exemplary C-shaped cross section, L1 identifies a radially-extending portion of the upper surface 82 from which it is desired to remove the undesired materials 78. The region 100 is also shown adjacent to the edge 90 of the wafer 58. For this exemplary C-shaped cross section, the edge 90 is also a portion of the wafer surface from which it is desired to remove the undesired materials 78. The region 100 extends from C1 along the length L1 of the upper surface 82 (i.e., of edge exclusion area 82EEA), around the peripheral edge 90 and to the bottom surface 92 of the wafer. The region 100 extends along a bottom length L2 of the bottom surface 92 to C2. For this exemplary C-shaped cross section, L2 identifies a radially-extending portion of the lower surface 92 of the wafer 58 from which it is desired to remove the undesired materials 78. In this example, the edge environ 80 of the wafer 58 thus includes the lengths L1 and L2 and the edge 90, and for ease of description is identified in FIG. 2C as 80-C. The active etch zone 102 thus surrounds the edge environ 80-C.

In review, these combined configurations of the lower electrode 54 and the upper electrode 53 define the annular etching region 100 as an annular process chamber region between the lower electrode 54 and the top electrode 53. The region 100 defines the active etch, or active etching, zone 102 that is part of the chamber cavity 77. The embodiments of the present invention that align the upper electrode 53 with the lower electrode 54, and that promote uniformity of processing of the edge environ 80 that is to be subjected to the processing, e.g., etching, are configured so that the alignment of the upper electrode 53 with the lower electrode 54 results in the annular etching region 100 and the active etch zone 102 extending uniformly around (and separate from) the inactive etch zone 86. In more detail, as viewed in FIG. 2C, the above-defined uniform spacing provides the same distance 86D between the first and second reference surfaces 56 and 60 measured at various radial distances from the axis X so that the plasma does not light up in the thin space 84 and the devices on the central area 70 are not damaged. That uniform spacing providing the same distance 86D also uniformly defines the active etch zone 102 and promotes uniformity of processing of the edge environ 80-C all around the axis X.

With the distances 84 the same at the exemplary radial distances from the axis X for the inactive zone 86, FIG. 2C shows a distance 102D1 between a configurable portion, or ring, 110 of the upper electrode 53 and a configurable portion, or ring, 120 of the lower electrode 54. By the embodiments of the present invention that align the upper electrode 53 with the lower electrode 54, the distance 102D1 is the same when measured at various places around the axis X and within the active etch zone 102. Also, a distance 102D2 is the same when measured at various places around the axis X and within the active etch zone 102, and a distance 102D3 is the same when measured at various places around the axis X and within the active etch zone 102. As a result, the embodiments of the present invention that align the upper electrode 53 with the lower electrode 54 result in the action of the plasma on the edge environ 80-C being uniform all around the axis X.

One exemplary configuration of the active etch zone 102 is shown in FIG. 2C in connection with etch defining rings 110 and 120, and the above-described distances 102D1-102D3 are shown related to these rings 110 and 120. FIG. 2C shows a border B between the end C1 of the exemplary annular etching region 100 and the exemplary inactive etch zone 86 described above. Also, FIG. 2B indicates the radial location of the border B, and shows the border as being circular and adjacent to the end C1 of the line 102L that identifies the active etch zone 102. The border B may be located radially relative to the axis X according to a wafer specification, and is generally outward from the outside of the insert 69 of the top electrode 53. The distances 102D1-102D3 that are to be the same may be measured at any of various places around the axis X.

The configuration of each of the rings 110 may relate to the above-described desired orientation provided by the linkage 66 between the first and second reference surfaces 56 and 60. An example of such desired orientation was the first and second reference surfaces 56 and 60 being parallel. As described with respect to the ring 110, a top etch defining ring, the configuration of each of the rings 120 may also relate to the above-described exemplary desired orientation, e.g., the first and second reference surfaces 56 and 60 being parallel. FIG. 2C shows one embodiment of the ring 120, a bottom etch defining ring, of the chuck 54 configured with a bottom annular recess 122. The bottom annular recess 122 is configured with a wall 124 located radially from the axis X to provide the length L2. The bottom annular recess 122 is further configured with a wall 126 separated from the surface 92 of the wafer by the space 102D3, the separation being in the axial direction 74 (FIG. 2A) to allow region 100 to extend across the lower edge exclusion area (referred to but not shown as 92EEA). In the desired parallel orientation resulting from the embodiments of the present invention, and with the lower electrode 54 in the second positional relationship (FIG. 2C), the bottom annular recess 122 defines a lower cavity section 128 of the chamber cavity 77. The lower cavity section 128 is under the lower surface 92 of the lower edge environ area 80-C of the wafer 58. The lower cavity section 128 of the chamber cavity 77 is oriented relative to the lower edge environ 80-C to define a lower portion of the annular etching region 100 and of the active etching zone 102 to permit etching of the lower edge environ 80-C. The portion of the lower edge environ 80-C that is etched by plasma in the lower cavity section 128 corresponds to the bottom wafer surface 92 exposed to the plasma along the length L2 shown in FIG. 2C. If there is not to be any etching of the lower surface 92 of the wafer, the value of lower L2 is zero, and the bottom etch defining ring 120 has no lower cavity section 128. In this case, the active etch zone 102 would be an exemplary upside-down L-shape. In reverse, if there is not to be any etching of the upper surface 82 of the wafer, the value of upper L1 is zero, and the top etch defining ring 110 has no upper cavity section 129. In this case, the active etch zone 102 would be an exemplary L-shape.

It may be understood that with the use of selected configurations of the rings 110 and 120, the base 52 and the upper electrode 53 may be configured so that the selected top etch defining ring 110 is mounted on the upper electrode 53 and the selected bottom ring 120 is mounted on the lower electrode 54. In the example of the exemplary C-shaped active etch zone 102, this configuration defines an amount of etching of the top edge exclusion area 82EEA of the wafer, the amount coinciding with the length L1 and extending around the axis X. This exemplary configuration also defines an amount of etching of the bottom edge exclusion area 92EEA of the wafer, the amount coinciding with the length L2 and extending around the axis X. This exemplary configuration also defines etching of the edge 90 of the exclusion area 82EEA of the wafer, the etching extending around the axis X.

As also described generally above, FIG. 2C shows that by the embodiments of the present invention, and with the distances 102D1 the same at exemplary distances from the axis X, the distance 102D3 between the wall 126 and the lower edge environ 80EEA (e.g., surface 92) is the same when measured at various places around the axis X and within the active etch zone 102. FIG. 2C also shows that with the distances 102D1-102D3 the same at exemplary distances from the axis X, the distance between portion 68X of the configurable ring 110 and surface 126 of the configurable ring 120 of the lower electrode 54 is the same when measured at various places around the axis X and within the active etch zone 102. As a result, by the alignment resulting from use of the present embodiments, in the active etch zone 102 the action of the plasma on the edge environ 80-C is uniform all around the axis X.

Referring to the drive 62 in more detail, FIG. 2B shows the annular etching region 100 extending in an annular path around the wafer 58. The etch defining rings 110 and 120 also extend in an annular path around the wafer 58. The inactive etch zone 86 also extends radially across the wafer 58 and axially between the central area 70 and the second reference surface 60 defined by the center area 68. To assure uniform etching of the edge environ 80 around the axis X, the positional relationships between the surfaces 56 and 60 are to be and remain parallel. This means that an established parallelism of the surfaces 56 and 60 remains during movement of the upper electrode 53 (via the linkage 66 and the drive 62) into and in each of the first and second positional relationships. Thus, the parallelism remains during the movement between those relationships. This parallelism provides that for the described uniform removal of the undesired materials 78: (1) the upper surface 82 of the wafer 58 is uniformly in close proximity to the center area 68 of the upper electrode 53, and (2) the edge environ 80 is centered axially in the annular etching region 100 for uniform etching of the undesired materials 78 to take place.

Figure 4:
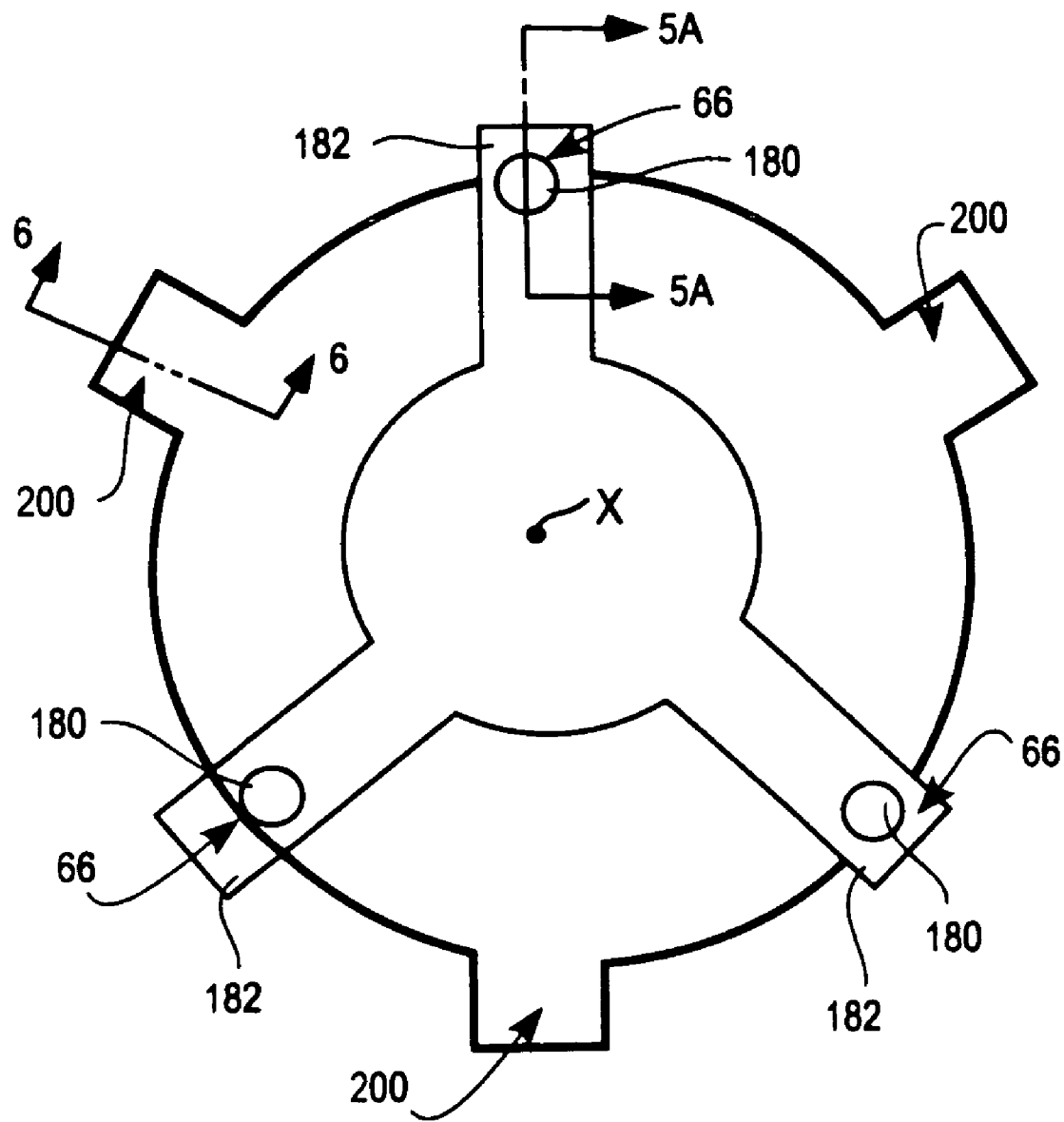
FIG. 4 is a plan view taken on line 4-4 in FIG. 1, showing the spacing around a wafer axis of sections of a drive that operates through sections of an adjustable linkage for moving the reference surfaces into the positional relationships.
Figure 5A:
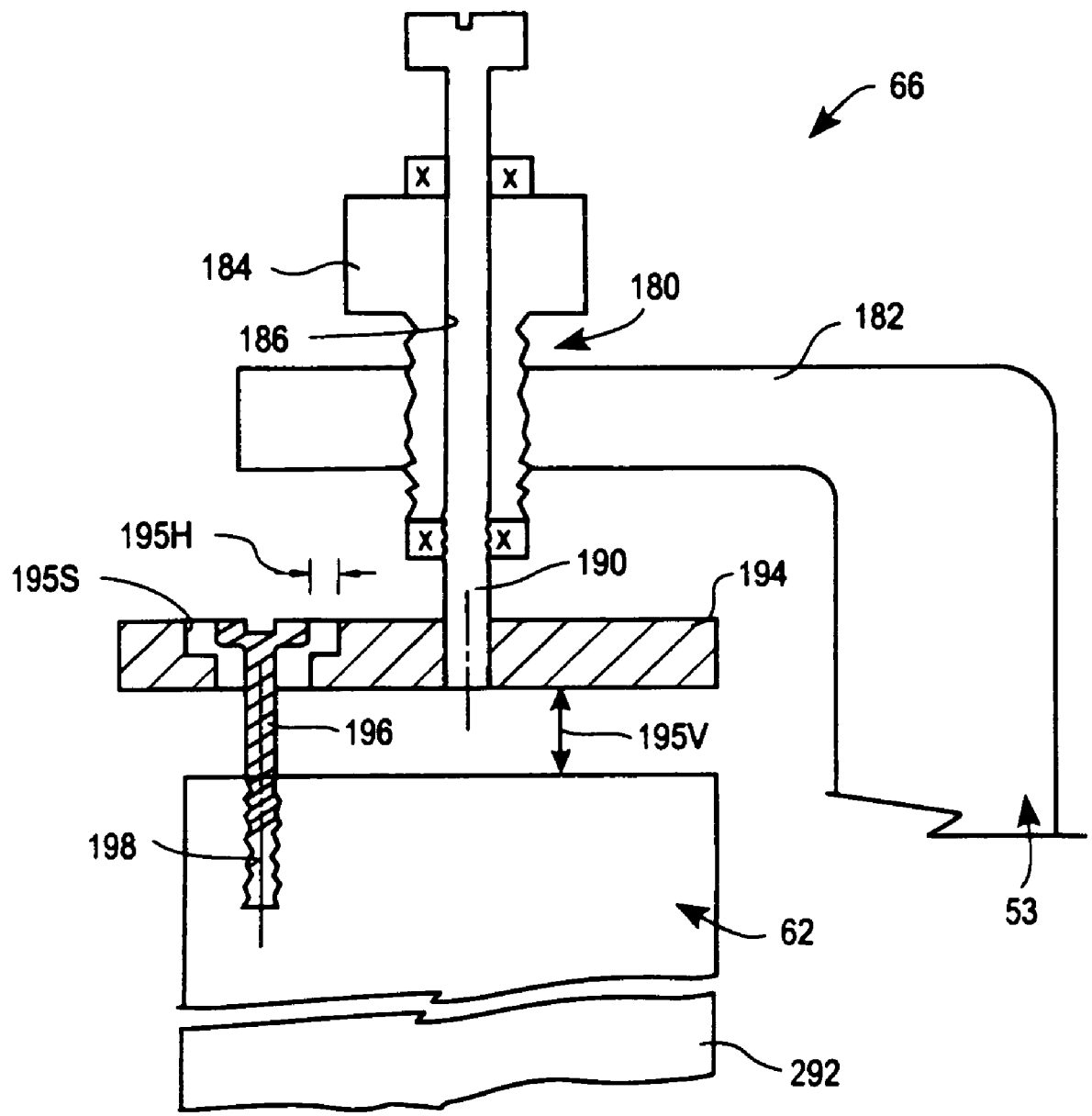
FIG. 5A is an enlarged cross sectional view taken on line 5A-5A in FIG. 4 showing one section of the linkage in a loosened configuration to facilitate orienting the second reference surface with respect to the first reference surface that is in a desired existing orientation.
Figure 5B:
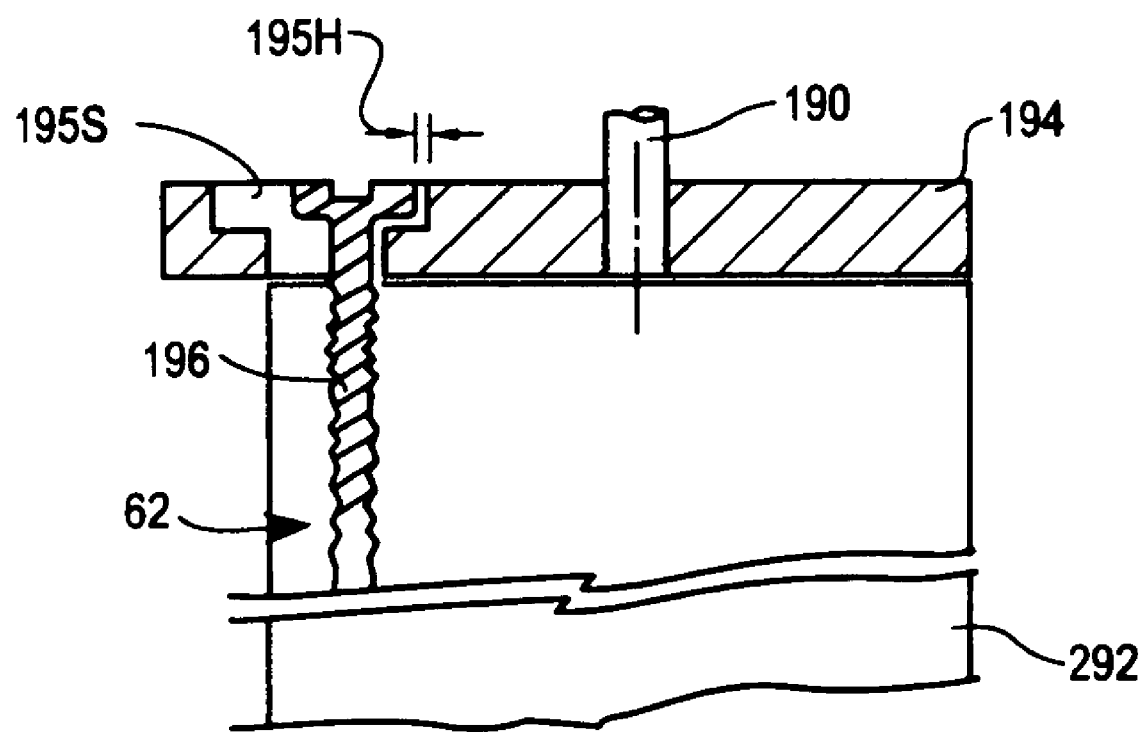
FIG. 5B is an enlarged cross sectional view showing part of the linkage shown in FIG. 5A, illustrating the linkage in a tightened configuration to hold the second reference surface oriented with respect to the first reference surface.

Before use of the process chamber 50, in conjunction with embodiments of the present invention the linkage 66 is adjusted to maintain the established parallel and centered positional relationship of the surfaces 56 and 60, i.e., the established orientation. Referring to the plan view of FIG. 4, the linkage 66 is shown configured in exemplary three sections 180 spaced around the axis X at exemplary 120 degree intervals. The following describes one section 180, and is applicable to all of the sections 180. The linkage section 180 cooperates with a first arm 182 that is secured to the upper electrode 53. The arm 182 is shown in FIGS. 4 & 5A extending horizontally from the upper electrode 53 into the linkage section 180. With the linkage section 180 loosened as described below, the arm 182 orients the loosened linkage section 180 according to how the upper electrode 53 is positioned when the first and second reference surfaces 56 and 60 are parallel and centered. Thus, each arm 182 and loosened section 180 may be oriented differently with respect to the axis X. With this arm and section 180 orientation in mind, reference is made to FIG. 5A that shows a vertical section of a typical linkage section 180 with the oriented arm 182. FIG. 5A shows a loose, or loosened, configuration of the section 180. FIG. 5B shows the section 180 in a tight, or tightened, configuration.

Still referring to FIG. 5A, the oriented arm 182 is shown extending horizontally, and secured to an adjuster block 184. The block 184 is configured with a bore 186 to receive an adjuster screw 190 for rotation. Appropriate rotation moves the screw 190 up or down, for example. The screw 190 is secured to a lock member, or plate, 194. Referring to the loosened configuration of the section 180 shown in FIG. 5A, exemplary screw movement up moves the lock member 194 up to condition the linkage section 180 for orienting of the upper electrode 53 relative to the desired existing orientation of the lower electrode 54. Before such orienting is performed, the up movement of the lock member 194 relative to the block 184 provides an alignment space 195V between the drive 62 and the lock member 194. In a general sense, the alignment space 195V allows the upper electrode 53 to assume an aligned parallel relationship with the lower electrode 54, as described below. In detail, the alignment space 195V has an initial value determined by an amount of rotation of the screw 190. The initial value of the space 195V is sufficient to allow the upper electrode 53 to assume that aligned parallel relationship with the lower electrode 54 without having the lock member 194 touch the drive 62. Thus, the value of the space 195V may change from the initial value as the upper electrode 53 is oriented (e.g., vertically) relative to the desired existing orientation of the lower electrode 54. When the orientation is done, each space 195V of the various sections 180 has some positive value as determined by the oriented upper electrode 53.

Also, the lock member 194 is configured with a slot 195S that defines an alignment space 195H between the lock member 194 and a fastener (such as a lock screw 196). The screw 196 is secured in a threaded bore 198 in the drive 62 at a fixed horizontal location as viewed in FIG. 5A. The slot 195S is configured so that the alignment space 195H extends around the lock screw 196, separating the lock member 194 from the lock screw 196. In general, the slot 195H is configured to define an initial value (FIG. 5A) of the space 195H sufficient to allow the lock member 194 to be moved by the upper electrode 53 relative to the fastener 196 as the upper electrode 53 assumes the aligned centered relationship with respect to the lower electrode 54, as described below. For example, such movement may be as shown in FIG. 5B (horizontal and to the left), allowing the upper electrode 53 to become aligned and centered with respect to the axis X on which the lower electrode 54 is centered. The initial value of the space 195H is sufficient to allow the upper electrode 53 to assume that aligned centered relationship with the lower electrode 54 without having a wall of the slot 195S touch the screw 196. Thus, the value of the space 195H may change from the initial value as the upper electrode 53 is oriented (e.g., moved horizontally to the left) relative to the desired existing orientation of the lower electrode 54. When that orientation is done, each space 195H of the various sections 180 has some positive value shown in FIG. 5B. Thus, the initial value of the alignment space 195H may be determined by the amount and direction (left or right) of the anticipated horizontal movement required to allow the upper electrode 53 to become centered with respect to the axis X (and the lower electrode 54) without the slot 195S touching the screw 196.

In review, before this orienting, each section 180 is configured with the alignment spaces 195H and 195V to allow the orienting without having the lock member 194 touch the drive 62, and without the wall of the slot 195S touching the screw 196. For each section 180, the orienting of the upper electrode 53 relative to the desired existing orientation of the lower electrode 54 may result in the initial values of the alignment spaces 195V and 195H being changed. FIG. 5B shows that following that orienting, by rotation of the screw 190 the lock member 194 may be moved downwardly from the changed up position (as changed by the orienting) until the lock member 194 moves away from the arm 182 and touches the drive 62. Care is taken to not rotate the screw 190 more than required for the lock member 194 to just touch the drive 62, so that the orientation of the upper electrode 53 is not changed by such lock member 194. As the lock member 194 moves to touch the drive 62, the slot 195S that defines the alignment space 195H remains spaced from the lock screw 196. The lock member 194 is locked to the drive 62 by turning the lock screw 196 into the threaded bore 198 that extends into the drive 62. The lock screw 196 extends through the slot 195S and the head of the screw 196 presses on the lock member 194 to urge the lock member 194 against the drive 62. The lock member 194 held against the drive 62 is held in a position based on the centered and aligned position (orientation) of the upper electrode 53 with respect to the lower electrode 54. Thus, once the lock member 194 is secured to the drive 62, the oriented arm 182 does not move relative to the lock member 194 and the upper electrode 53 is held by the drive 62 oriented with respect to the lower electrode 54. This locking of the lock member 194 to the drive 62 (with a zero value of the space 195V, for example, by the lock screw 196 extending through the slot 195S and holding the member 194 tight against the drive 62) is referred to as the tightened (or tight) configuration of the linkage section 180 of the linkage 66.

As described, each linkage section 180 may be the same. Thus, the same structure as is described for the one linkage section 180 is provided for the sections 180 at the other exemplary two spaced locations. The same type of rotation of the screw 190, and the same locking of the lock member 194 to the drive 62, occurs in each section 180. By the collective action of the various sections 180, the orientation of the upper electrode 53 is not changed by the tightening of the linkage sections 180 into the respective tightened configurations. In this manner, there is no change in the established parallel and centered positional relationship of the surfaces 56 and 60. The many sections 180 cooperate to secure the upper electrode 53 to the drive 62 and to maintain that established parallel and centered positional relationship of the surfaces 56 and 60.

Figure 6:
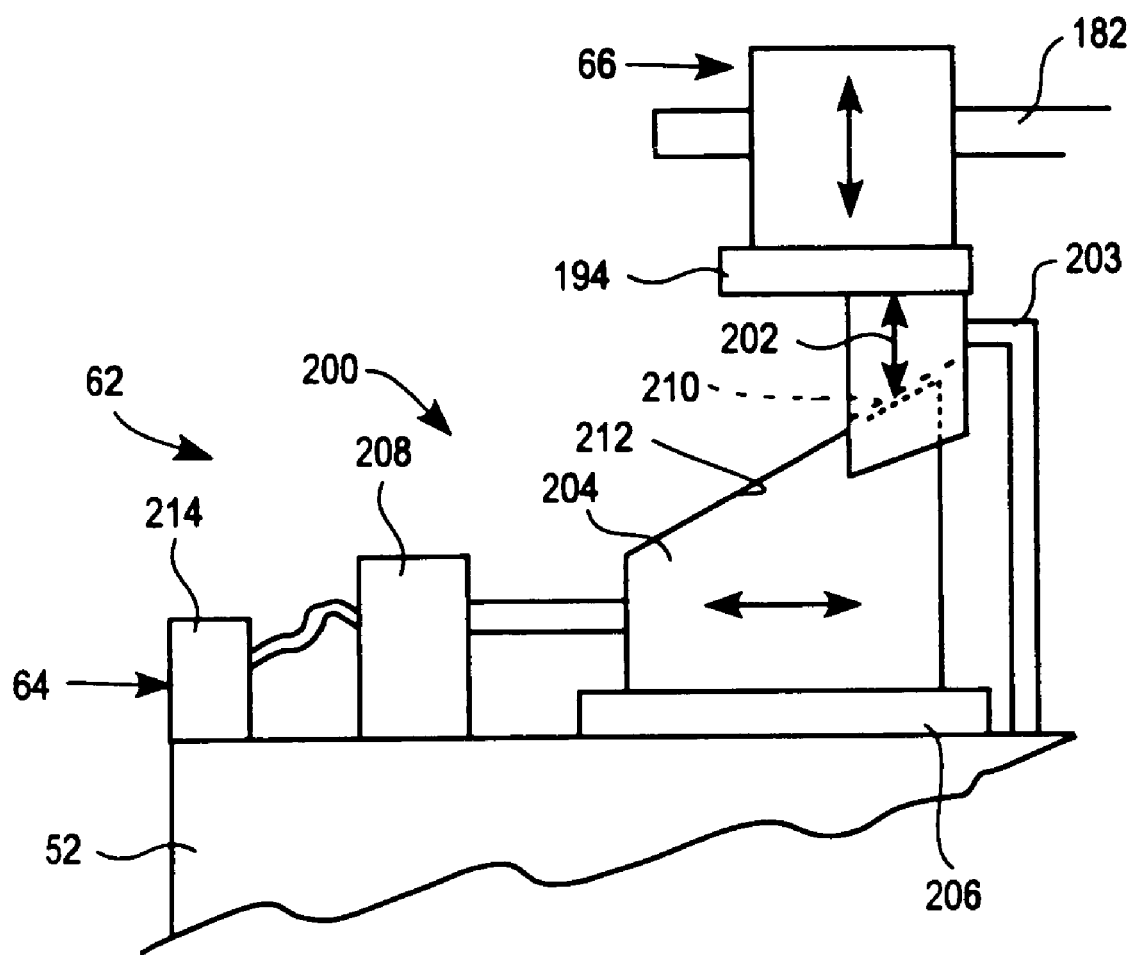
FIG. 6 cross sectional view taken on line 6-6 in FIG. 4, showing the configuration of one of the sections of the drive.

With the linkage sections 180 secured to the drive 62, the drive 62 may be operated. One embodiment of the drive 62 may be the wedge assembly 64. Referring to FIG. 6, a representative one wedge section 200 of three wedge sections of the wedge assembly 64 is shown. The sections 200 are located around the axis X as shown in FIG. 4. Each wedge section 200 may be the same. Thus, the same structure as is described for the one wedge section 200 is provided at the other two spaced locations. The one exemplary section 200 is configured with a first wedge member 202 that may be secured by the bolt 196 (FIG. 5B) to the lock member 194. A first slide 203 holds the wedge member 202 against horizontal movement, permitting the first wedge member 202 to move the lock member 194 up and down to correspondingly move the arm 182 and the upper electrode 53. This up and down movement is under the action of a second wedge member 204 that is connected to a second slide 206 mounted on the base 52. A motor 208 may be actuated to move the second wedge member 204 horizontally on the slide 206 so that a first inclined surface 210 of the first wedge member 202 is urged up, for example, by a second inclined surface 212 of the second wedge member 204. Oppositely, reverse actuation of the motor 208 causes the surface 212 to allow the first wedge member 202 to move down.

As indicated, the same structure as is described for the wedge sections 200 is at each of the three spaced locations. Also, the motor 208 of each wedge section 200 may be actuated, for example, by hydraulic fluid from a common manifold 214 so that the same fluid pressure is applied to each motor and the same upward or downward motion is applied at the same time by each wedge section 200 shown in FIG. 4. In this manner, the upper electrode 53 is moved up and down so that there is no change in the established parallel and centered positional relationship of the surfaces 56 and 60, and the upper electrode 53 moves while maintaining that established parallel and centered positional relationship of the surfaces 56 and 60.

It may be understood from FIGS. 1 and 6 that by the motor 208 moving the second wedge member 204 to the left, the first wedge member 202 is moved up and moves the upper electrode 53 and the second reference surface 60 upward away from the first reference surface 56 into the first positional relationship (FIG. 2A). Oppositely, by the motor 208 moving the second wedge member 204 to the right in FIGS. 1 and 6, the first wedge member 202 is allowed to move down to allow the upper electrode and the second reference surface 60 to move down toward the first reference surface 56 into the second positional relationship (FIG. 2C).

In this manner, by the angular shapes of the first wedge member 202 and second wedge member 204, the drive 62, via the exemplary wedge assembly 64, is configured to apply a driving force through the linkage 66 to the upper electrode 53. This force acts through each linkage section 180 equally so that the desired orientation, which is the surfaces 56 and 60 parallel and centered (resulting in the upper wafer surface 82 also parallel and centered relative to the reference surface 60), is maintained by the moving first wedge member 202 driving the linkage 66 to move the upper electrode 53. In review, one such movement may be the upper electrode 53 moving the second reference surface 60 into the second positional relationship (FIG. 2C), wherein the second positional relationship is the second reference surface 60 in close proximity with the first reference surface 56, and thus the upper surface 82 of the wafer 58 also in close proximity to the second reference surface 60, to define the inactive etch zone 86 in the process chamber 50. Such close proximity of the second reference surface 60 with the first reference surface 56 configures the inactive etching zone 86 with the exemplary dimension in the direction of the X axis of about 0.010 inches to about 0.020 inches, for example. With the described multiple linkage sections 180 and wedge sections 200, such dimension in the direction of movement may be provided within the dimensional tolerance of about plus or minus 0.002 inches. This dimension of the space 84 in the direction of movement is repeatable during the relative movement of the upper electrode 53 and the lower electrode 54, e.g., due to the positional relationships between the surfaces 56 and 60 remaining parallel and centered to assure the uniform etching of the edge environ 80 around the axis X. In each case of the space 84 and the region 100, there is the above-described uniformity all around the axis X.

Figure 7A:
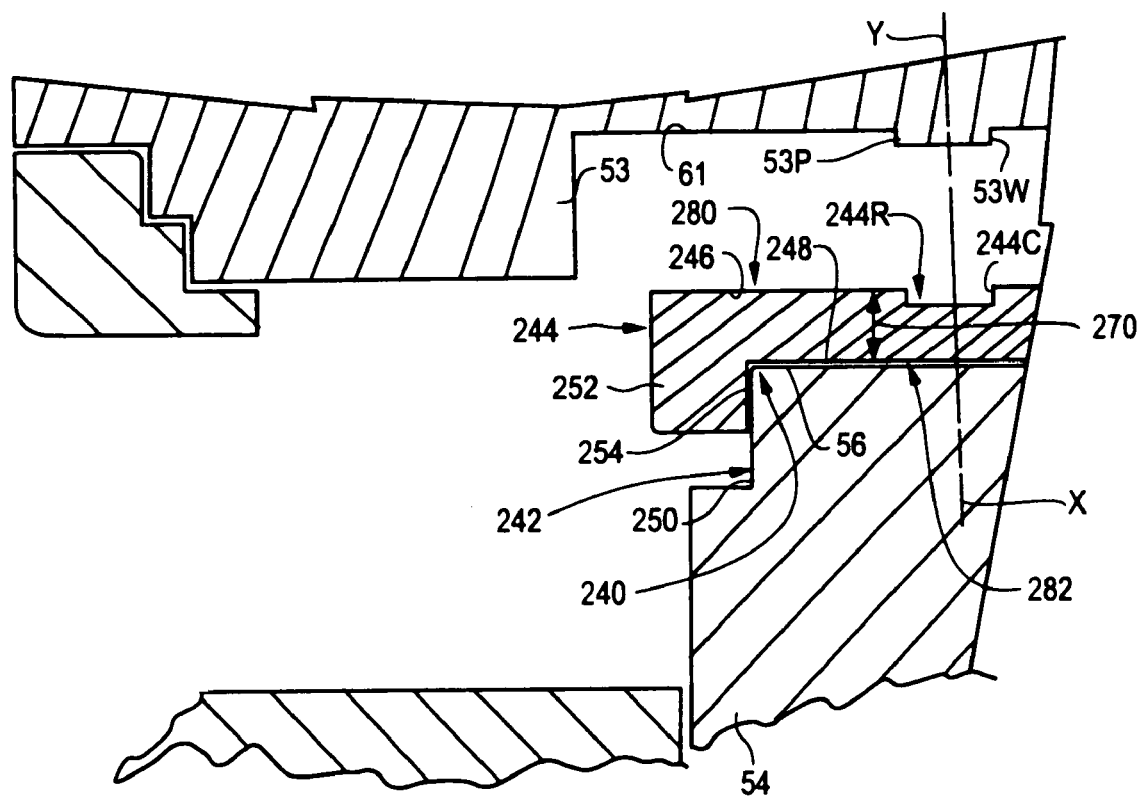
FIG. 7A is a cross sectional view similar to FIG. 2A, in which the process exclusion insert and the rings have been removed, illustrating a fixture for use with the electrodes shown in FIGS. 1-3 to orient the first and second reference surfaces and establish a desired positional relationship between the lower electrode and the upper electrode.

With the above-described structure and operations in mind, the details of embodiments of the present invention may readily be understood. Referring first to FIG. 3, the upper electrode 53 is shown with the insert 69 attached so that the inner reference surface 69I is against the third reference surface 61 and the projection 53P is in the recess 69R. The ring 110 is shown held on the upper electrode 53 by shoulder 132. In this configuration of FIG. 3, the apparatus 100 has been aligned and centered for etching the edge environ 80. Reference to FIG. 7A, in comparison to FIG. 3, shows that some of the structure of FIG. 3 of the apparatus 100 has been removed and is not shown in FIG. 7A. For example, the insert 69 and the ring 110 shown in FIG. 3 have been removed from the upper electrode 53. This is done by removing a fastener (not shown) that removably secures the insert 69 to the top electrode 53 with the surface 69I tight against the surface 61. Such removal of the fastener releases the insert 69 so that the shoulder 132 no longer holds the ring 110 on the top electrode 53. Also, the wafer 58 shown in FIG. 3 is not on the lower reference surface 56 of the lower electrode 54 and the ring 120 has been removed from the lower electrode 54 by lifting the ring 120 off the lower electrode 54. Further, as described above, the linkage 66 is adjusted into the loose configuration with respect to the upper electrode 53, i.e., loose, not tightly connected to the base 52 or drive 62.

By the absence of the insert 69, the rings 110 and 120, and the wafer 58, and with the linkage 66 in the loose configuration, the alignment spaces 195V and 195H (FIG. 5A) allow the upper electrode 53 to assume the aligned parallel and centered relationship with respect to the lower electrode 54.

Thus, the apparatus 100 is in condition to be prepared for an alignment and centering, or orientation, operation according to embodiments of the present invention. In FIG. 7A the upper electrode 53 is shown configured with the third reference surface 61 extending radially away from the axis X. The third reference surface 61 is to become aligned with the first reference surface 56 of the lower electrode 54. Because the second reference surface 60 and the surface 69I of the insert 69 are parallel, upon reassembly of the insert 69 with the upper electrode 53 to place the surface 69I against the third reference surface 61, the second reference surface 60 of the insert 69 will also be parallel to the first reference surface 56. Also, if the projection 53P of the upper electrode 53 is centered with respect to the lower electrode 54, upon reassembly of the insert 69 with the projection 53P in the recess 69R, the insert 69 will also be centered with respect to the lower electrode 54.

In FIG. 7A the lower electrode 54 is shown configured with the first reference surface 56 extending radially to a shoulder 240 having vertical wall 242. The shoulder 240 may be configured with a circular cross section (in plan view). The upper electrode 53 is shown spaced from the lower electrode 54, such that these electrodes may be referred to as spaced electrodes with spaced reference surfaces (i.e. reference surfaces 56 & 61). A fixture 244 is shown configured with an upper fixture reference surface 246 and a lower fixture reference surface 248 parallel to the upper fixture reference surface 246. The lower fixture reference surface 248 is configured to be supported on the first (spaced) reference surface 56 to orient the lower fixture reference surface 248 and the upper fixture reference surface 246 parallel to the first reference surface 56. The upper fixture reference surface 246 is configured to support the third (spaced) reference surface 61 to orient the third spaced reference surface 61 parallel to the upper fixture reference surface 246 and parallel to the first (spaced) reference surface 56.

FIG. 7A also shows the first (spaced) reference surface 56 configured with a periphery 250 spaced from and coaxial with the axis X. The periphery 250 may be defined by the vertical wall 242, and in plan view similar to FIG. 2B both are configured with circular cross sections and are concentric with the axis X. The fixture 244 is also shown further configured with respect to the axis X as follows. The lower fixture reference surface 248 is configured with an annular rim 252 having an annular inner wall 254. The rim 252 & wall 254 extend parallel to the wall 242, overhanging the first reference surface 56. The annular inner wall 254 is configured with respect to the axis X so that with the lower fixture reference surface 248 supported on the first (spaced) reference surface 56 the inner wall 254 extends parallel to and coaxial with the axis X, and surrounds the wall 252 and periphery 250. The inner wall 254 is configured spaced from axis X to tightly receive the wall 242 and the periphery 250 to center the fixture 244 on the first (spaced) reference surface 56 and relative to the axis X.

Figure 7B:
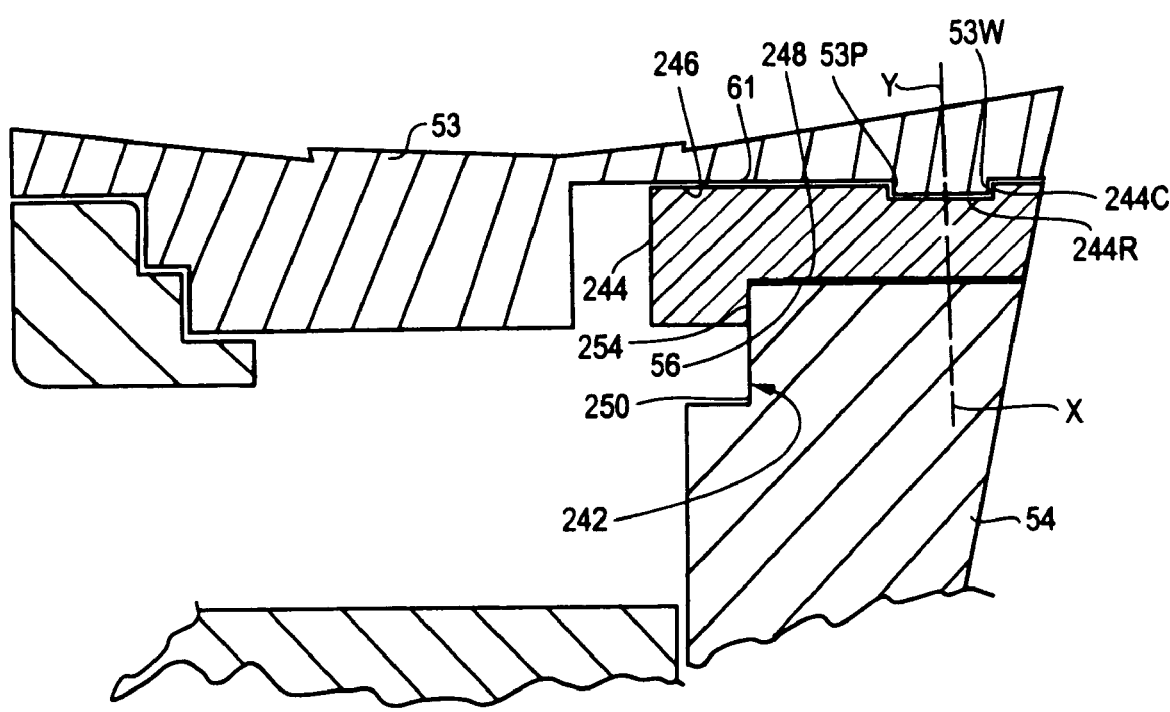
FIG. 7B is a cross sectional view similar to FIG. 7A, illustrating the upper electrode resting on the fixture to orient the second electrode reference surface with respect to the first reference surface.

With the fixture 244 centered on the first (spaced) reference surface 56, and noting that the projection 53P is configured coaxial with an upper electrode axis Y, and with the upper fixture reference surface 246 configured with a recess (or opening) 244R extending into the fixture 244 coaxially with respect to the axis X, FIG. 7B shows that the fixture 244 is configured to center the upper electrode 53 with respect to the lower electrode 54. The recess 244R is configured with a centering surface 244C coaxial with the inner wall 254 of the fixture 244.

To mate the upper electrode 53 and the fixture 244 for the alignment and centering, the upper electrode 53 is moved (e.g., by hand) toward the lower electrode 54 (shown as down in FIG. 7A). The upper electrode 53 is gently placed on the fixture 244 (FIG. 7B). As the upper electrode 53 is lowered, the upper electrode 53 is guided side-to-side (perpendicular to the axis X) to insert the projection 53P into the recess 244R (as allowed by the spaces 195H and 195V. For clarity of illustration, the surface 244C is shown in FIG. 7B slightly spaced from the wall 53W of the projection 53P. The centering surface 244C, and the recess 244R, are configured to snugly receive the projection 53P and the wall 53W to center the projection 53P with respect to the axis X (i.e., with axis Y coaxial with axis X). As a result, the projection 53P centers the upper electrode 53 with respect to the axis X. During this lowering, the initial values of the alignment spaces 195H and 195V of each section 180 (FIGS. 5A & 5B) may be changed as the upper electrode 53 becomes oriented relative to the desired existing orientation of the lower electrode 54. To complete the orientation, the upper electrode 53 is fully placed on the fixture 244 so that the third reference surface 61 rests on the upper fixture reference surface 246. Upon completion of the orienting of the upper electrode 53 relative to the desired existing orientation of the lower electrode 54, different values of the alignment spaces 195H and 195V of each section 180 may exist as compared to the initial values, and these different values result as the third reference surface 61 becomes parallel to the lower electrode (or first) reference surface 56, for example, and as the projection 53P becomes centered with respect to the axis X, all by the action of the fixture 244.

By the use of the insert 69 as described above, it may be understood that the wafer process chamber 50 is configured to exclude processing of the central area (bracket 70E) of the wafer 58. The central area 70E generally has an area corresponding to the area of the upper fixture reference surface 246. Each of the insert 69 and the wafer 58 has a thickness in the direction of the axis X. With this in mind, it may be understood that the fixture 244 is configured so that the lower fixture reference surface 248 and the upper fixture reference surface 246 are spaced by an alignment distance 270 (FIG. 7A). The alignment distance 270 is not shown to scale in FIG. 7A, but is configured having a value equal to the sum of the thicknesses of the wafer 58 and of the insert 69 and of the distance 84 (FIG. 2C) that defines the inactive zone 86 of the process chamber 50. Such inactive etch zone 86 excludes the processing of the central area 70 of the wafer. Such alignment distance 270 is provided so that with the upper electrode 53 resting on fixture 244 (as shown in FIG. 7B) during the described alignment and centering, the fixture spaces the third reference surface 61 from the first reference surface 56 as those two surfaces will be spaced in the operation of the plasma chamber 50 to etch the edge environ 80 and to not etch the central area 70 of the wafer 58. Thus, the alignment and centering occurs with the same spacing of the upper and lower electrodes 53 and 54 as is to be used in the processing of the wafer 58. This reduces a likelihood of non-uniformity of the spaces 84 & 102D1-D3 around the axis X and fosters the desired uniformity described above. For example, the uniform space around the axis X maintains the inactive etch zone 86 inactive to protect the wafer devices from the plasma. Also, the described centering of the upper electrode 53 with respect to the lower electrode 54 assures that the radial extent of the annular etching zone 100 will be uniform all of the way around the axis X. Thus, equal etching of the undesired materials 78 will occur on the edge environ 80 all around the axis X by the permitted etching operation in the toroidal etching region 100.

The following operations may be performed to maintain this established orientation with the upper reference surface 61 parallel to the lower electrode reference surface 56 and the upper electrode 53 centered with respect to the lower electrode 54 (i.e., aligned and centered with respect to the axis X). The upper electrode 53 was described above as resting on the fixture 244 (i.e., with the third reference surface 61 resting on the upper fixture reference surface 246 and the projection 53P snugly received in the recess 244R). Recall that each section 180 of the linkage 66 may have been moved during the orientation, and the respective alignment spaces 195H and 195V of each section 180 may have been changed as necessary to allow the upper electrode 53 to become oriented parallel and centered with respect to the lower electrode 54. With the upper electrode 53 so resting, and with the changed values of the spaces 195H and 195V, the linkage 66 is then adjusted as described above so that each section 180 becomes configured in the tightened configuration. This tightened configuration secures the upper electrode 53 to the drive 62 to maintain the established orientation (the upper reference surface 61 parallel to the lower electrode reference surface 56 and the upper electrode 53 centered with respect to the lower electrode 54). The drive 62 may then be actuated to lift the upper electrode 53 off the fixture 244 and back to the position shown in FIG. 7A, for example. The fixture 244 may then be removed from the lower electrode 54 and the apparatus 100 may then be returned to the exemplary configuration shown in and described above with respect to FIG. 3 or another configuration shown in the Related Application. As shown in FIG. 3, the ring 110 is mounted against and held against the electrode 53. The insert 69 is mounted on and secured to the upper electrode 53 centered (by the projection 53P and the recess 69R). The centering is with respect to the axis X. Upon securing the insert 69 to the upper electrode 53, the ring 110 is held by the shoulders 132 and 130 on the upper electrode 53. Also, by the now-parallel lower electrode reference surface 56 and third reference surface 61, the insert surface 69I is parallel to surface 61, resulting in the parallel and centered surfaces 56 and 60. The ring 120 and the wafer are placed on the electrode 54, and the aligned and centered apparatus 100 is ready for use to remove the material 78 from the edge environ 80 of the wafer 58.

In review, embodiments of the present invention have been described in terms of the apparatus 100 for orienting the upper electrode 53 relative to a desired existing orientation of the lower electrode 54 in the wafer process chamber 50. The electrodes 53 and 54 are configured with the respective reference surfaces 56 and 60, and the electrode 53 is also configured with the third reference surface 61. Referring to FIG. 7A, the fixture 244 may be described as being configured with an upper nest 280 and a lower nest 282. The upper nest 280 is configured from the upper fixture reference surface 246 and the centering surface (or upper wall) 244C. The lower nest 282 is configured from the lower fixture reference surface 248 and the inner (or lower) annular wall 254 of the annular rim 252. The lower fixture reference surface 248 is parallel to the upper fixture reference surface 246. The upper wall 244C is coaxial with and parallel to the lower wall 254. Each of the upper nest 280 and lower nest 282 is configured to receive at least a portion of the respective upper electrode reference surface 61 and lower electrode reference surface 56. The portion of surface 61 is the projection 53P. The at least a portion of surface 56 is the entire surface 56 between diametrically opposed parts of the annular rim 252. The nests 280 and 282 orient the upper electrode 53 relative to the desired existing orientation of the lower electrode 54 by aligning the lower fixture reference surface 248 and the upper fixture reference surface 246 parallel to the lower electrode reference surface 60 and by centering the upper electrode 53 relative to the lower electrode 54.

Embodiments of the present invention may include the apparatus 100 configured with the base 52 having a bottom section 290 (FIG. 1) to support the lower electrode 54 with the lower electrode reference surface 56 in the existing orientation as desired for etching the edge environ 80. The base 52 is further configured with a frame 292 that supports the drive 62. The linkage 66 may be referred to as an adapter in that the linkage 66 is adjustable as described above. Via the linkage 66, the adapter is between the frame 292 and the upper electrode 53. The adapter (linkage 66) is adjustable between the described loose configuration and the tight configuration so that in the loose configuration the adapter defines the variable alignment spaces 195H and 195V between the adapter 66 and the frame 292 (supporting the drive 62). The initial values of the alignment surfaces 195H and 195V may be changed during the orientation to allow the upper electrode 53 to assume the aligned parallel and centered relationship with respect to the lower electrode 54. As oriented, the alignment spaces 195H and 195V have changed values as determined by the upper electrode 53 oriented by the nests 280 and 282 relative to the desired existing orientation of the lower electrode 54. The upper fixture reference surface 61 of the upper electrode 53 is thus in an aligned parallel and centered relationship with the lower electrode reference surface 56 so that the insert (second) reference surface 60 is in the same aligned parallel and centered relationship upon assembly of the insert 69 with the upper electrode 53.

In further review, in the tight configuration the adapter 66 is secured to the frame 292 (via the drive 62) to eliminate the variable alignment spaces 195V of each of the sections 180 and to hold each of the alignment spaces 195H tight once the upper electrode 53 is in the centered orientation, so that the upper electrode 53 is mounted to the frame 292 (via the drive 62) with the upper electrode 53 remaining in the aligned parallel and centered orientation with respect to the desired existing orientation of the lower electrode 54 in the wafer process chamber 50.

It may be understood that the centering of the upper electrode 53 relative to the lower electrode 54 is relative to the central axis X of the lower electrode 54. The adapter 66 is configured with the plurality of connectors that are in the form of the sections 180. The sections 180 are uniformly spaced around the axis X. Each of the connectors (sections 180) is configured to be adjustable between (a) the loose configuration relative to a portion of the frame 292 (i.e., adjacent to the respective section 180) and (b) the tight configuration (shown in FIG. 5B) relative to the respective portion of the frame 292. In that manner via the tight configuration each connector section 180 is secured to the respective portion of the frame 292 and the connectors collectively mount the upper electrode 53 to the frame 292 with the upper electrode 53 remaining in the aligned parallel and centered orientation with respect to the desired existing orientation of the lower electrode 54 in the wafer process chamber 50.

With the uniform spacing of the connectors (sections 180) around the axis X, the alignment spaces 195H and 195V (e.g., between one of the portions of the frame 292 and one of the respective connectors, or sections, 180) may have values different from the values of the alignment spaces 195H and 195V between another portion of the frame 292 and another one of the respective connectors 180. Each of the connectors 180 is configured to be adjustable in the direction of the axis X by varying amounts. In this manner, upon orientation of the upper electrode 53, even though the alignment space 195V between one of the portions of the frame 292 and the one of the respective connectors 180 has a value different from the alignment space 195V between another portion of the frame 292 and another one of the respective connectors 180, the upper electrode 53 may be secured to each portion of the frame 292 that corresponds to the respective connector 180. The same applies to the various alignment spaces 195H. The securing of the lock members 194 of the sections 180 in the tightened configuration mounts the upper electrode 53 to the portions of the frame 292 with the upper electrode 53 remaining in the aligned parallel and centered orientation with respect to the desired existing orientation of the lower electrode 53 in the wafer process chamber 50.

As described above, the adapter (section 180) includes the lock member 194 configured to be selectably secured by the bolt 196 to (and touching) the portion of the frame 292, both vertically and horizontally tight. Alternatively, the lock member 194 may be separated by the alignment space 195V from the portion of the frame 292 and may be separated by the alignment space 195H of the slot 195S from the bolt 196. The adapter (linkage 66) includes an adjustment mechanism (e.g., in the form of the screw 190 mounted on the arm 182 of the upper electrode 53 and connected to the plate 194) to define the value (e.g., the initial value) of the alignment space 195V. The adjustment mechanism also includes the slot 195S to define the initial value of the alignment space 195H. In this manner, during orienting by the nests 280 and 282 the upper electrode 53 is enabled to modify the initial values of the alignment spaces 195H and 195V according to the desired existing orientation of the lower electrode 54. The adjustment mechanism (including the screw 190) is further configured to move the spaced lock member 194 vertically into contact with the portion of the frame 292, and the slot 195S is configured to allow the head of the lock screw 196 to urge the lock member 194 against the drive 62 to secure the lock member 194 to the portion of the frame 292 to hold the upper electrode 53 secured to the frame 292 as oriented by the nests 280 and 282.

Embodiments of the present invention may also include the apparatus 100 configured with the drive 62 secured to the frame 292 and configured to move the adapter 66 to move the upper electrode 53 relative to the lower electrode 54 as described. For each section 180, the plate 194 is configured to be selectably secured by the screw 196 to the respective portion of the frame 292 to define the tight configuration or to be separated by the variable alignment spaces 195H and 195V from the respective portion of the frame 292 to define the loose configuration. These two alignment spaces 195H and 195V of one section 180 may be referred to as a pair of spaces 195H and 195V. For such pair of spaces, the adjustment mechanism (in the form of the section 180 mounted on the upper electrode 53 and connected to the respective plate 194) defines the initial values of the variable alignment space 195V, in which a space 195V is between each of the plates 194 and the portion of the frame 292 in the loose configuration. Such adjustment mechanism further in the form of the section 180 mounted on the upper electrode 53 and connected to the respective plate 194 further defines the initial value of the variable alignment spaces 195H, in which the space 195H is between the slot 195S and the screw 196 is attached to the respective portion of the frame 292 in the loose configuration. The initial values of the variable alignment spaces 195H and 195V are sufficient to allow the upper electrode 53 to assume the aligned parallel and centered relationship with the lower electrode 54 by varying the initial values of the variable alignment spaces 195H and 195V according to (as required by) the aligned parallel and centered relationship of the upper electrode 53 relative to the desired existing orientation of the lower electrode 54.

In addition, the apparatus 100 may be described as establishing positional relationships in the process chamber 50 for protecting the exclusion area within the edge environ 80 of the wafer 58. Embodiments of the present invention may include the apparatus 100 configured with the lower electrode 54. The lower electrode 54 may be configured with the first electrode reference surface 56 to support the wafer 58 to be processed on the edge environ 80. The base 52 is configured with the frame 292, the base being configured to mount the lower electrode 54 with the first electrode reference surface 56 in a desired orientation for processing the edge environ 80 and not processing the central area 70 of the wafer 58. The process exclusion insert 69 is configured with the respective parallel first and second insert surfaces 69I and 60 for protecting the exclusion area (central area 70) from processing. The upper electrode 53 is configured with the third electrode reference surface 61 to removably mount the insert 69 with the first insert surface 69I against the third electrode reference surface 61 and the insert surface 69I parallel to the electrode reference surface 61. The alignment fixture 244 is configured for use with the upper electrode 53 and lower electrode 54 instead of the insert 69. The fixture 244 is configured with the upper fixture reference surface 246 and the lower fixture reference surface 248 parallel to the upper fixture reference surface. The fixture 244 is configured so that the lower fixture reference surface 248 mates with the first electrode reference surface 56 to support the fixture 244 on the lower electrode 54 with the lower fixture reference surface 248 and the upper fixture reference surface 246 in the desired orientation parallel to the first electrode reference surface 56. The fixture 244 is configured so that the upper fixture reference surface 246 mates with the third electrode reference surface 61 to removably support the upper electrode 53 on the fixture 244 with the upper (third electrode) reference surface 61 in the desired orientation parallel to upper fixture reference surface 246.

The adapter in the form of the linkage 66 between the frame 292 and the upper electrode 53 is adjustable between the loose configuration and the tight configuration described above. In the loose configuration the adapter 66 defines the variable alignment spaces 195H and 195V between the adapter 66 and the frame 292. The initial values of the variable alignment spaces 195H and 195V allow the upper electrode 53 supported on the fixture 244 to be in the desired orientation. In the tight configuration the adapter 66 secures the upper electrode 53 fixed to the frame 292 with the upper electrode 53 in the desired orientation to permit removal of the fixture 244 and mounting of the ring 110 and insert 69 on the upper electrode 53 while the upper electrode remains in the desired orientation to protect the central area 70 of the wafer 58 from processing and to remove the undesired materials 78 from the edge environ 80.

The wafer 58 is configured with the wafer thickness as viewed in FIG. 2C in the direction of the axis X. The insert 69 is also configured with an insert thickness (i.e., the alignment thickness 270), so that with the upper electrode 53 above the lower electrode 54 in the same vertical position as the upper electrode 53 was positioned when resting on the fixture 244, the insert 69 defines the inactive process zone 86 between the wafer 58 and the insert 69 (i.e., between the surface 82 and the surface 60). The inactive process zone 86 has the thickness of the space 84. The drive 62 is secured to the frame 292 and is configured to move the adapter 66 to move the upper electrode 53 relative to the lower electrode 54. The fixture 244 is configured so that the lower fixture reference surface 248 and the upper fixture reference surface 246 are spaced by the alignment thickness 270 having a value equal to the sum of the wafer thickness and the insert thickness and the thickness of the inactive zone 84 so that the desired orientation of the upper electrode 53 is provided with the upper electrode 53 at a first location relative the lower electrode 54 (i.e., electrode 53 resting on fixture 244). The first location corresponds to the location of the upper electrode 54 with the insert 69 mounted to define the inactive process zone 86 having the thickness 84 (FIG. 2C).

It may be understood that the lower electrode reference surface 56 is configured coaxial with the axis X that may also be referred to as an electrode axis X. The lower electrode reference surface 56 and the fixture 244 are configured to center the fixture 244 with respect to the axis X, as described with respect to the wall 254 and the shoulder 240. The fixture 244 and electrode reference surface 61 are configured to center the upper electrode 53 with respect to the axis X as described with respect to the projection 53P and the centering surface 244C.

Figure 8:
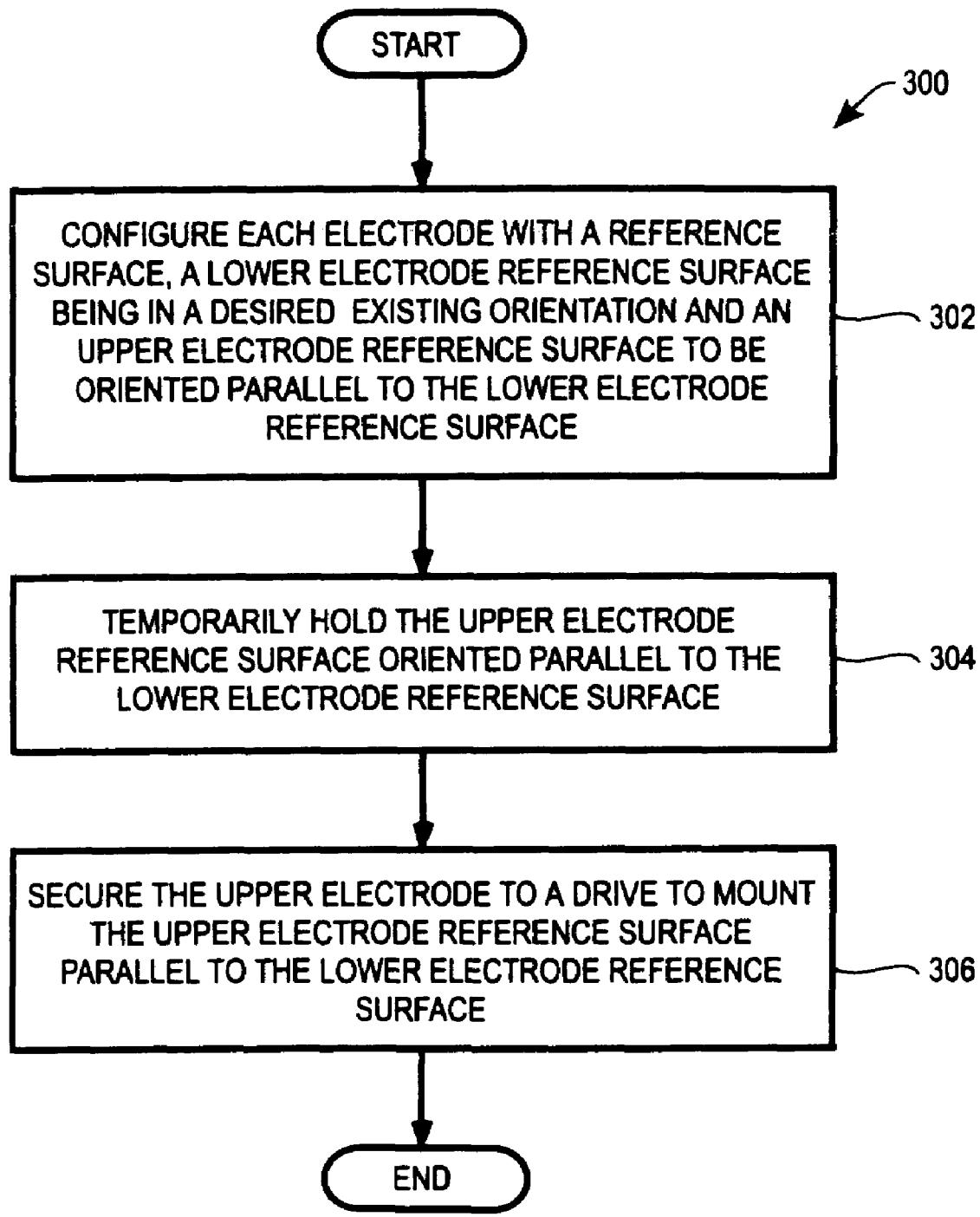
FIG. 8 is a flow chart depicting operations of a method of one embodiment of the present invention for orienting the upper electrode relative to a desired orientation of the lower electrode in a wafer process chamber to define active and inactive process zones in the process chamber.

It may be understood that embodiments of the present invention may include a method of orienting the upper electrode 53 relative to the lower electrode 54, as defined by a flow chart 300 shown in FIG. 8. The lower electrode 54 has a desired existing orientation in the process chamber 50, e.g., on the base 52. The orienting is to define the active process (or etching) zone 102 and the inactive process zone 86 in the process chamber 50 for processing the wafer 58. The method may move from start to an operation 302 of configuring each electrode 53 and 54 with a reference surface. A lower electrode reference surface 56 may be in the desired existing orientation and the upper electrode reference surface 61 is to be oriented parallel to the lower electrode reference surface 56. The method may move to an operation 304 of temporarily holding the upper electrode reference surface 61 oriented parallel to the lower electrode reference surface 56. Such holding may be by the fixture 244 as described above. The method may move to an operation 306 of securing the upper electrode 53 to a drive (e.g., 62) to mount and fix the upper electrode reference surface 61 parallel to the lower electrode reference surface 56. Such securing may be by the adapter 66 and the bolts 196 of the plates 194, for example, and the method may be done.

Other aspects of the method may include the holding operation 304 effective to space the upper electrode reference surface 61 from the lower electrode reference surface 56 by a fixture thickness. The fixture thickness may be equal to the sum of the thickness of the wafer and the thickness 84 of the inactive process zone 86 and a thickness of the process exclusion insert 69 secured to the upper electrode reference surface 61. This holding operation 304 may be understood by reference to the fixture 244. The fixture is configured so that the lower fixture reference surface 248 and the upper fixture reference surface 246 are spaced by the alignment distance 270 having the value equal to the sum of the thicknesses of the wafer 58 and of the insert 69 and of the distance 84 (FIG. 2C) that defines the inactive portion of the process chamber 50 (i.e., that defines the inactive etch zone 86) that excludes the processing of the central area 70 of the wafer. Such alignment distance 270 is provided so that when the fixture 244 is resting on surface 56 as shown in FIG. 7B during the described alignment and centering, the fixture 244 spaces the third reference surface 61 from the first reference surface 56 by an amount that is the same as those two surfaces 56 & 61 will be spaced in the operation of the plasma chamber 50 for the removing of the materials 78 from the edge environ 80. The result is that the apparatus of FIG. 2C may uniformly etch the edge environ 80 all around the axis X, and not etch the central area 70 of the wafer 58 anywhere around the axis X. Thus, the alignment and centering by the fixture 244 occurs with the same spacing of the upper and lower electrodes 53 and 54 as is to be used in the processing of the wafer 58, with the benefit described above.

It may be understood that the method may further include operations of attaching the process exclusion insert 69 to the upper electrode 53 after removal of the fixture 244 from the lower electrode 54. Also, an operation may mount the wafer 58 on the lower electrode reference surface 56. The drive 62 may be operated to move the upper electrode 53 toward the lower electrode 54 to space the process exclusion insert 69 (surface 60) from the surface 82 of the wafer 58 by the thickness 84 of the inactive process zone 86. As described above, by the use of the fixture 244, the thickness of the inactive process zone 86 may be uniform across the wafer 58 and between the wafer 58 and the process exclusion insert 69, and all around the axis X.

Embodiments of the method may include the holding operation 304 including an operation of placing the alignment fixture 244 on the lower electrode reference surface 56. The upper electrode 53 may be moved onto the alignment fixture 244 while allowing the upper electrode 53 to freely move relative to the drive 62 and the frame 292 (as when the linkage 66 is in the loose configuration). The various alignment spaces 195H and 195V allow such free movement of the upper electrode 53. The upper electrode 53 may thus become oriented so that the upper electrode reference surface 61 is oriented parallel to the lower electrode reference surface 56 and centered with respect to the axis X, without interference from the drive 62 or the frame.

In view of the above description, apparatus and methods are provided for rapidly orienting the upper electrode 53 with the lower electrode 54 that has been placed in a desired orientation. The orienting allows removal of the undesired materials uniformly from the edge environ 80 in a manner that removes the undesired materials 78 from only the edge environ 80 and does not damage the central area 70. The described orientation meets the above need to assure that the etching apparatus is accurately aligned before use, so that in use the apparatus (with the rings 110 & 120, for example) results in accurate (e.g., uniform) removal of the undesired materials 78 from the entire edge environ 80, without removing materials from or otherwise damaging the central area 68.

The embodiments of the present invention also fill the above-described needs by being configured for uniform removal of the undesired materials 78 from the entire edge environ 80 (i.e., around the annular edge area of the upper wafer surface 82 that surrounds the central area 70, and around the edge 90 of the wafer, and under the edge area along the bottom surface 92 near the edge 90 of the wafer 58). Such uniform removal is without removing materials from or otherwise damaging the central area 70. The operation of the linkage sections 180 so that there is no change in the established parallel and centered positional relationship of the surfaces 56 and 60, and the operation of the many sections 180 that cooperate to secure the top electrode 53 to the base 52 while maintaining that established parallel and centered positional relationship of the surfaces 56 and 60, contribute to filling these needs. For example, this is by establishing and maintaining the close proximity of the surfaces 56 and 60 uniformly all around the axis X, so that there is the axially-thin space 84 that defines the chamber cavity 77 as being configured with the inactive etching zone 86 uniformly around the axis X between the central area 70 of the wafer and the center area 68 of the top electrode 53

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Apparatus for orienting an upper electrode relative to a desired existing orientation of a lower electrode in a wafer process chamber, each electrode being configured with a reference surface, the apparatus comprising:
a fixture configured with an upper nest and a lower nest, the upper nest being configured with an upper fixture reference surface and an upper wall, the lower nest being configured with a lower fixture reference surface and a lower wall, the lower fixture reference surface being parallel to the upper fixture reference surface, the upper wall being coaxial with and parallel to the lower wall, each of the upper nest and lower nest being configured to receive at least a portion of the respective upper and lower electrode reference surface, the nests orienting the upper electrode relative to the desired existing orientation of the lower electrode by aligning the lower fixture reference surface and the upper fixture reference surface parallel to the lower electrode reference surface and by centering the upper electrode relative to the lower electrode.

2. Apparatus as recited in claim 1, further comprising:
a base configured with a bottom section to support the lower electrode with the lower electrode reference surface in the existing orientation, the base being further configured with a frame; and
an adapter between the frame and the upper electrode, the adapter being adjustable between a loose configuration and a tight configuration, in the loose configuration the adapter defining variable alignment spaces between the adapter and the frame to allow the upper electrode to become oriented in an aligned parallel and centered relationship with respect to the lower electrode in the desired existing orientation, the alignment spaces having values determined by the upper electrode in the oriented relationship.

3. Apparatus in claim 2, wherein in the tight configuration the adapter is secured to the frame to mount the upper electrode fixed to the frame with the upper electrode remaining in the oriented relationship.

4. Apparatus as recited in claim 3, wherein the centering of the upper electrode relative to the lower electrode is relative to a central axis of the lower electrode, and wherein:
the adapter is configured with a plurality of connectors, the connectors are uniformly spaced around the axis, and each of the connectors is configured to be adjustable between the loose configuration relative to a portion of the frame and the tight configuration relative to the respective portion of the frame.

5. Apparatus as recited in claim 4, wherein in the tight configuration each connector is secured to the respective portion of the frame and the connectors collectively mount the upper electrode fixed to the frame with the upper electrode remaining in the oriented relationship with respect to the desired existing orientation of the lower electrode in the wafer process chamber.

6. Apparatus as recited in claim 4, wherein the uniform spacing of the connectors around the axis allows the alignment space between one of the portions of the frame and one of the respective connectors to have a value different from another alignment space between another portion of the frame and another one of the respective connectors.

7. Apparatus as recited in claim 6, wherein each of the connectors is configured to be adjustable by varying amounts to mount the upper electrode fixed to the frame even though the alignment space between one of the portions of the frame and the one of the respective connectors has a value different from the alignment space between another portion of the frame and another one of the respective connectors, wherein the mounting of the upper electrode fixed to the frame is with the upper electrode remaining in the oriented relationship with respect to the desired existing orientation of the lower electrode in the wafer process chamber.

8. Apparatus as recited in claim 2, wherein:
the adapter comprises a plate configured to be selectably fixed to the frame or separated by one of the alignment spaces from the frame;
the adapter further comprises an adjustment mechanism mounted on the upper electrode and connected to the plate to move the plate and define an initial value of the one alignment space so that the upper electrode as oriented by the nests is positioned to modify the initial value of the alignment space according to the desired existing orientation of the lower electrode; and
the adjustment mechanism is further configured to move the spaced plate into contact with the frame to enable the plate to be fixed to the frame to hold the upper electrode as oriented by the nests.

9. Apparatus as recited in claim 2, wherein:
the apparatus further comprises a drive secured to the frame and configured to move the adapter to move the upper electrode relative to the lower electrode;
the adapter further comprises a plate configured to be selectably secured to the drive to define the tight configuration or loosely spaced by a pair of variable alignment spaces with respect to the drive to define the loose configuration;
the adapter further comprises an adjustment mechanism mounted on the upper electrode and connected to the plate to define initial values of the pair of variable alignment spaces in the loose configuration of the adapter; and
the adjustment mechanism is configured so that the initial values of the variable alignment spaces are sufficient to allow the upper electrode to assume the aligned parallel and centered relationship with respect to the lower electrode by varying the initial values according to the desired existing orientation of the lower electrode.

10. Apparatus for establishing positional relationships in a process chamber for protecting an exclusion area within an edge environ of a wafer, the apparatus comprising:
a lower electrode configured with a first electrode reference surface to support a wafer to be processed on the edge environ;
a base configured with a frame, the base being configured to mount the lower electrode with the first electrode reference surface in a desired orientation for processing the edge environ and not the exclusion area of the wafer;
a process exclusion insert configured with parallel first and second insert surfaces for protecting the exclusion area from processing;
an upper electrode configured with a second electrode reference surface to removably mount the insert with the first insert surface against the second electrode reference surface and the second insert surface parallel to the second electrode reference surface;
an alignment fixture configured for use with the upper electrode and the lower electrode instead of the insert, the fixture being configured with an upper fixture reference surface and a lower fixture reference surface parallel to the upper fixture reference surface, the fixture being configured so that the lower fixture reference surface mates with the first electrode reference surface to support the fixture on the lower electrode with the lower fixture reference surface and the upper fixture reference surface in the desired orientation, the fixture being configured so that the upper fixture reference surface mates with the second electrode reference surface to removably support the upper electrode on the fixture with the upper electrode reference surface in the desired orientation parallel to the first electrode reference surface; and an adapter between the frame and the upper electrode, the adapter being adjustable between a loose configuration and a tight configuration, in the loose configuration the adapter defining variable alignment spaces between the adapter and the frame to allow the upper electrode supported on the fixture be in the desired orientation, in the tight configuration the adapter securing the upper electrode to the frame with the upper electrode in the desired orientation to permit removal of the fixture and mounting of the insert on the upper electrode while the upper electrode remains in the desired orientation to protect the exclusion area from processing.

11. Apparatus as recited in claim 10, wherein the wafer is configured with a wafer thickness, and wherein:

the insert is configured with an insert thickness for defining an inactive process zone between the wafer and the insert, the inactive process zone having an inactive zone thickness;

the apparatus further comprises a drive secured to the frame and configured to move the adapter to move the upper electrode relative to the lower electrode; and the fixture is configured so that the lower fixture reference surface and the upper fixture reference surface are spaced by an alignment distance having a value equal to the sum of the wafer thickness and the insert thickness and the thickness of the inactive zone so that the desired orientation of the upper electrode is provided with the upper electrode at a first location relative the lower electrode, the first location corresponding to the location of the upper electrode with the insert mounted for defining the inactive process zone having the inactive zone thickness.

12. Apparatus as recited in claim 10, wherein:

the first electrode reference surface is configured coaxial with an electrode axis;

the first electrode reference surface and the fixture are configured to center the fixture with respect to the axis; and the fixture and the second electrode reference surface are configured to center the upper electrode with respect to the axis.

* * * * *